(12) United States Patent
Kanno et al.

(10) Patent No.: US 9,608,189 B2
(45) Date of Patent: Mar. 28, 2017

(54) THERMOELECTRIC GENERATOR UNIT AND METHOD OF TESTING THE THERMOELECTRIC GENERATOR UNIT

(71) Applicant: Panasonic Intellectual Property Management Co., Ltd., Osaka (JP)

(72) Inventors: Tsutomu Kanno, Kyoto (JP); Akihiro Sakai, Nara (JP); Kohei Takahashi, Osaka (JP); Hiromasa Tamaki, Osaka (JP); Hideo Kusada, Osaka (JP); Yuka Yamada, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 230 days.

(21) Appl. No.: 14/675,923

(22) Filed: Apr. 1, 2015

(65) Prior Publication Data
US 2015/0207054 A1    Jul. 23, 2015

Related U.S. Application Data

(63) Continuation of application No. PCT/JP2014/003090, filed on Jun. 10, 2014.

(30) Foreign Application Priority Data

Jul. 2, 2013 (JP) .................. 2013-139040

(51) Int. Cl.
    *H01L 35/32* (2006.01)
    *H01L 35/30* (2006.01)
    *G01R 31/34* (2006.01)

(52) U.S. Cl.
    CPC ............ *H01L 35/32* (2013.01); *G01R 31/343* (2013.01); *H01L 35/30* (2013.01)

(58) Field of Classification Search
    None
    See application file for complete search history.

(56) References Cited

U.S. PATENT DOCUMENTS 6,127,766 A * 10/2000 Roidt .................. H01L 35/30
                                                        136/205
2008/0173343 A1   7/2008 Kanno et al.
(Continued)

FOREIGN PATENT DOCUMENTS

| JP | 2010-010637 A | 1/2010 |
| JP | 2012-510146 T | 4/2012 |

(Continued)

OTHER PUBLICATIONS

International Search Report for corresponding International Application No. PCT/JP2014/003090 mailed Sep. 9, 2014.

(Continued)

*Primary Examiner* — Magali P Slawski
(74) *Attorney, Agent, or Firm* — Renner, Otto, Boisselle & Sklar, LLP

(57) ABSTRACT

A thermoelectric generator unit according to this disclosure includes a plurality of tubular thermoelectric generators, each of which generates electromotive force based on a difference in temperature between the inner and outer peripheral surfaces. The unit further includes a plurality of electrically conductive members providing electrical connection for the generators and a container housing the generators inside. The container includes a shell surrounding the generators and a pair of plates, at least one of which has a plurality of openings and channels. Each channel houses an electrically conductive member. The generators are electrically connected together in series via the electrically conductive member. At least one of the channels has an interconnection which connects at least two of the openings (Continued)

together and a testing hole portion. The testing hole portion runs from the interconnection through an outer edge of the at least one plate.

15 Claims, 27 Drawing Sheets

(56) References Cited

U.S. PATENT DOCUMENTS

| | | |
|---|---|---|
| 2011/0258995 A1 | 10/2011 | Limbeck et al. |
| 2013/0068273 A1 | 3/2013 | Kanno et al. |

FOREIGN PATENT DOCUMENTS

| | | |
|---|---|---|
| JP | 2013-016685 A | 1/2013 |
| WO | WO 2008/056466 A1 | 5/2008 |
| WO | WO 2012/014366 A1 | 2/2012 |

OTHER PUBLICATIONS

Kanno et al., "A Tubular Electric Power Generator Using Off-Diagonal Thermoelectric Effects", preprints from the 72nd Symposium of the Japan Society of Applied Physics, 30a-F-14, 2011 (with concise English translation).

Sakai et al., "Enhancement in performance of the tubular thermoelectric generation (TTEG)", International Conference on Thermoelectrics, 2012.

Kanno et al., "A Tubular Thermoelectric Generator with Piled Conical Rings Structure", Advanced Technology Research Laboratories, Panasonic Corporation, Kyoto, Japan Aug. 29, 2011.

Kanno et al., "Development of thermoelectric generation tube for utilising unutilized thermo energy", Panasonic Corporation, Japan, Jul. 24, 2012, pp. 100-108 (with concise English translation).

\* cited by examiner

THERMOELECTRIC GENERATOR UNIT AND METHOD OF TESTING THE THERMOELECTRIC GENERATOR UNIT

This is a continuation of International Application No. PCT/JP2014/003090, with an international filing date of Jun. 10, 2014, which claims priority of Japanese Patent Application No. 2013-139040, filed on Jul. 2, 2013, the contents of which are hereby incorporated by reference.

BACKGROUND

1. Technical Field

The present disclosure relates to a thermoelectric generator unit including a thermoelectric conversion element which converts heat into electric power, and also relates to a method of testing the thermoelectric generator unit.

2. Description of the Related Art

A thermoelectric conversion element is an element which can convert either heat into electric power or electric power into heat. A thermoelectric conversion element made of a thermoelectric material that exhibits the Seebeck effect can obtain thermal energy from a heat source at a relatively low temperature (of 200 degrees Celsius or less, for example) and can convert the thermal energy into electric power. With a thermoelectric generation technique based on such a thermoelectric conversion element, it is possible to collect and effectively utilize thermal energy which would conventionally have been dumped unused into the ambient in the form of steam, hot water, exhaust gas, or the like.

A thermoelectric conversion element made of a thermoelectric material will be hereinafter referred to as a "thermoelectric generator". A thermoelectric generator generally has a so-called "$\pi$ structure" where p- and n-type semiconductors, of which the carriers have mutually different electrical polarities, are combined together (see Japanese Laid-Open Patent Publication No. 2013-016685, for example). In a thermoelectric generator with the $\pi$ structure, a p-type semiconductor and an n-type semiconductor are connected together electrically in series together and thermally parallel with each other. In the $\pi$ structure, the direction of a temperature gradient and the direction of electric current flow are either mutually parallel or mutually antiparallel to each other. This makes it necessary to provide an output terminal on the high-temperature heat source side or the low-temperature heat source side. Consequently, to connect a plurality of such thermoelectric generators, each having the $\pi$ structure, electrically in series together, a complicated wiring structure is required.

PCT International Application Publication No. 2008/056466 (which will be hereinafter referred to as "Patent Document 1") discloses a thermoelectric generator including a stacked body of a bismuth layer and a layer of a different metal from bismuth between first and second electrodes that face each other. In the thermoelectric generator disclosed in Patent Document 1, the planes of stacking are inclined with respect to a line that connects the first and second electrodes together. PCT International Application Publication No. 2012/014366 (which will be hereinafter referred to as "Patent Document 2"), kanno et al., preprints from the $72^{nd}$ Symposium of the Japan Society of Applied Physics, 30a-F-14 "A Tubular Electric Power Generator Using Off-Diagonal Thermoelectric Effects" (2011), and A. Sakai et al., International conference on thermoelectrics 2012 "Enhancement in performance of the tubular thermoelectric generator (TTEG)" (2012) disclose tubular thermoelectric generators.

SUMMARY

Development of a practical thermoelectric generator unit that uses such thermoelectric generation technologies and a method of testing such a unit is awaited.

A thermoelectric generator unit according to the present disclosure includes a plurality of tubular thermoelectric generators. Each of the plurality of tubular thermoelectric generators has an outer peripheral surface, an inner peripheral surface and a flow path defined by the inner peripheral surface, and generates electromotive force in an axial direction of each said tubular thermoelectric generator based on a difference in temperature between the inner and outer peripheral surfaces. The thermoelectric generator unit further includes: a plurality of electrically conductive members providing electrical connection for the plurality of tubular thermoelectric generators, and a container housing the plurality of tubular thermoelectric generators inside. The container includes: fluid inlet and outlet ports through which a fluid flows inside the container, a plurality of openings into which the respective tubular thermoelectric generators are inserted, a shell surrounding the plurality of tubular thermoelectric generators, and a pair of plates. Each of the pair of plates is fixed to the shell and at least one of which has the plurality of openings and channels. Each channel houses an electrically conductive member. Respective ends of the tubular thermoelectric generators are inserted into the plurality of openings of the plates. At least one of the channels has an interconnection which connects at least two of the plurality of openings together and a testing hole portion which runs from the interconnection through an outer edge of the at least one plate. The plurality of tubular thermoelectric generators are electrically connected together in series via the electrically conductive member that is housed in the interconnection of the at least one channel.

A thermoelectric generator unit and method of testing the thermoelectric generator unit according to the present disclosure contributes to increasing the practicality of thermoelectric power generation.

These general and specific aspects may be implemented using a system and a method, and any combination of systems and methods.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

DETAILED DESCRIPTION

Figure 1A:
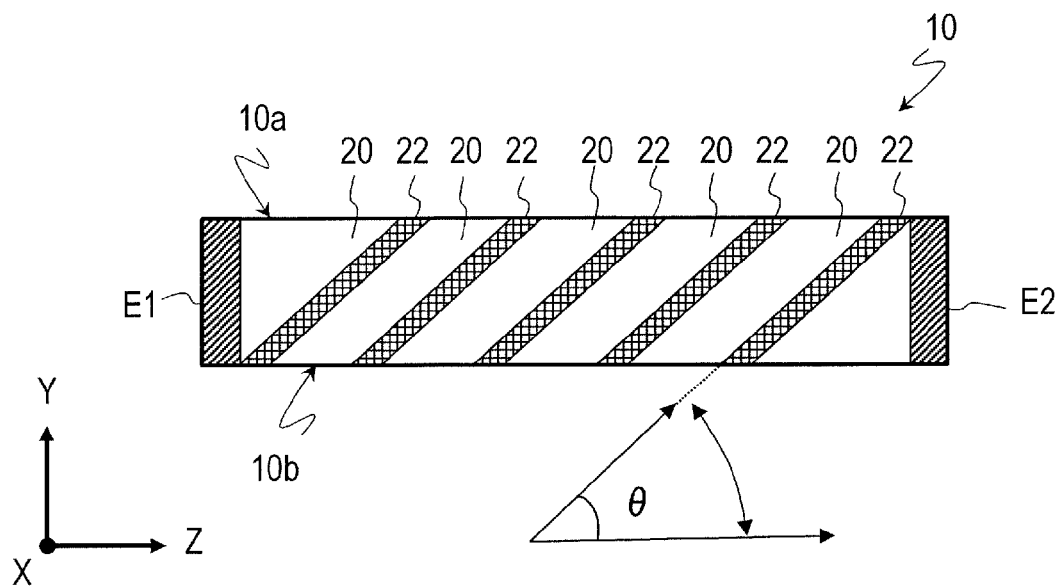
FIG. 1A is a schematic cross-sectional view of a thermoelectric generator 10.

A thermoelectric generator unit according to a non-limiting exemplary implementation of the present disclosure includes a plurality of tubular thermoelectric generators. Each of the tubular thermoelectric generators has an outer peripheral surface, an inner peripheral surface and a flow path defined by the inner peripheral surface. Each tubular thermoelectric generator is configured to generate electromotive force in its axial direction based on a difference in temperature between the inner and outer peripheral surfaces.

This thermoelectric generator unit further includes a container housing the plurality of tubular thermoelectric generators inside and a plurality of electrically conductive members providing electrical connection for the plurality of tubular thermoelectric generators. The container has fluid inlet and outlet ports through which a fluid flows inside the container, and a plurality of openings into which the respective tubular thermoelectric generators are inserted. The container also includes a shell surrounding the tubular thermoelectric generators and a pair of plates, each of the pair of plates is fixed to the shell. Each of the pair of plates has a plurality of openings and channels. Each channel houses an electrically conductive member.

Respective ends of the tubular thermoelectric generators are inserted into the plurality of openings of the plates. At least one of the channels has an interconnection which connects at least two of the plurality of openings together and a testing hole portion which runs from the interconnection through an outer edge of the at least one plate. And the plurality of tubular thermoelectric generators are electrically connected together in series via the electrically conductive member that is housed in the interconnection of the at least one channel.

As will be described in detail later, a thermoelectric generator unit according to an embodiment includes a plurality of tubular thermoelectric generators. Each of the tubular thermoelectric generators generates electromotive force based on a temperature difference created between the inner and outer peripheral surfaces of each of those generators, thereby taking electric power out of the thermoelectric generator unit. By connecting those tubular thermoelectric generators electrically in series together, the electromotive forces generated in those tubular thermoelectric generators can be superposed one upon the other, and even greater electric power can be extracted.

In this case, while the thermoelectric generator unit is operating, some failure could occur under harsh conditions in any of those tubular thermoelectric generators. For example, if the difference in temperature between the inner and outer peripheral surfaces of any tubular thermoelectric generator changes steeply or if the thermoelectric generator unit is operated for a long time continuously, the tubular thermoelectric generator would be subjected to mechanical or thermal stress and could get damaged. In such a situation, it would be beneficial if the failure could be located without breaking up the thermoelectric generator unit. According to an embodiment of the present disclosure, the failure can be located by a simple method without breaking up the thermoelectric generator unit, thus contributing to increasing practicality of thermoelectric power generation.

<Basic Configuration and Principle of Operation of Thermoelectric Generator>

Before embodiments of a thermoelectric generator unit according to the present disclosure are described, the basic configuration and principle of operation of a thermoelectric generator for use in the thermoelectric generator unit will be described. As will be described later, in a thermoelectric generator unit according to the present disclosure, a tubular thermoelectric generator is used. However, the principle of operation of such a tubular thermoelectric generator can also be understood more easily through description of the principle of operation of a thermoelectric generator in a simpler shape.

Figure 1B:
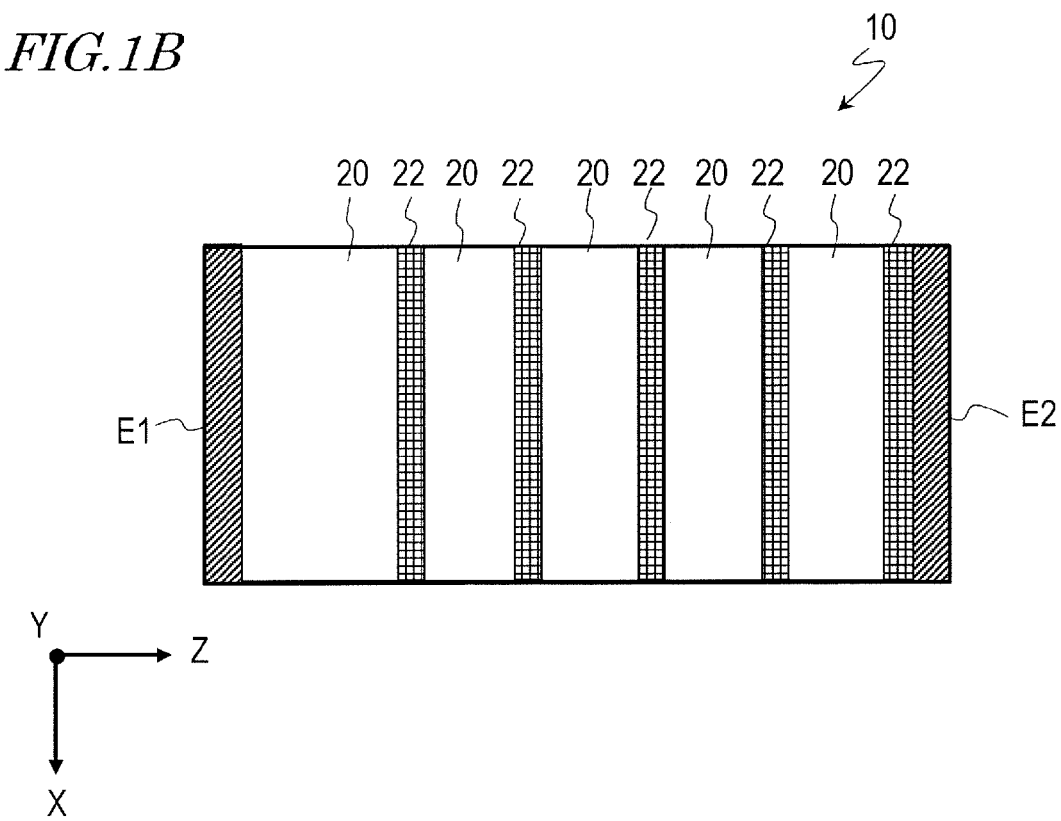
FIG. 1B is a top view of the thermoelectric generator 10 shown in FIG. 1A.

First of all, look at FIGS. 1A and 1B. FIG. 1A is a schematic cross-sectional view of a thermoelectric generator 10 with a generally rectangular parallelepiped shape, and FIG. 1B is a top view of the thermoelectric generator 10. For reference sake, X-, Y- and Z-axis that intersect with each other at right angles are shown in FIGS. 1A and 1B. The thermoelectric generator 10 shown in FIGS. 1A and 1B includes a stacked body with a structure in which multiple metal layers and thermoelectric material layers 22 are alternately stacked one upon the other so that their planes of stacking are inclined. Although the stacked body is supposed to have a rectangular parallelepiped shape in this example, the principle of operation will be the same even if the stacked body has any other shape.

In the thermoelectric generator 10 shown in FIGS. 1A and 1B, first and second electrodes E1 and E2 are arranged so as to sandwich the stacked body horizontally between them. In the cross section shown in FIG. 1A, the planes of stacking define an angle of inclination $\theta$ (where $0<\theta<\pi$ radians) with respect to the Z-axis direction. The angle of inclination $\theta$ will be hereinafter simply referred to as an "inclination angle".

In the thermoelectric generator 10 with such a configuration, when a temperature difference is created between its upper surface 10a and its lower surface 10b, the heat will be transferred preferentially through the metal layers 20 with higher thermal conductivity than the thermoelectric material layers 22. Thus, a Z-axis direction component is produced in the temperature gradient of each of those thermoelectric material layers 22. As a result, electromotive force occurs in the Z-axis direction in each thermoelectric material layer 22 due to the Seebeck effect, and eventually the electromotive forces are superposed one upon the other in series inside this stacked body. Consequently, a significant potential difference is created as a whole between the first and second electrodes E1 and E2. A thermoelectric generator including the stacked body shown in FIGS. 1A and 1B is disclosed in PCT International Application Publication No. 2008/056466 (Patent Document 1), the entire disclosure of which is hereby incorporated by reference.

Figure 2:
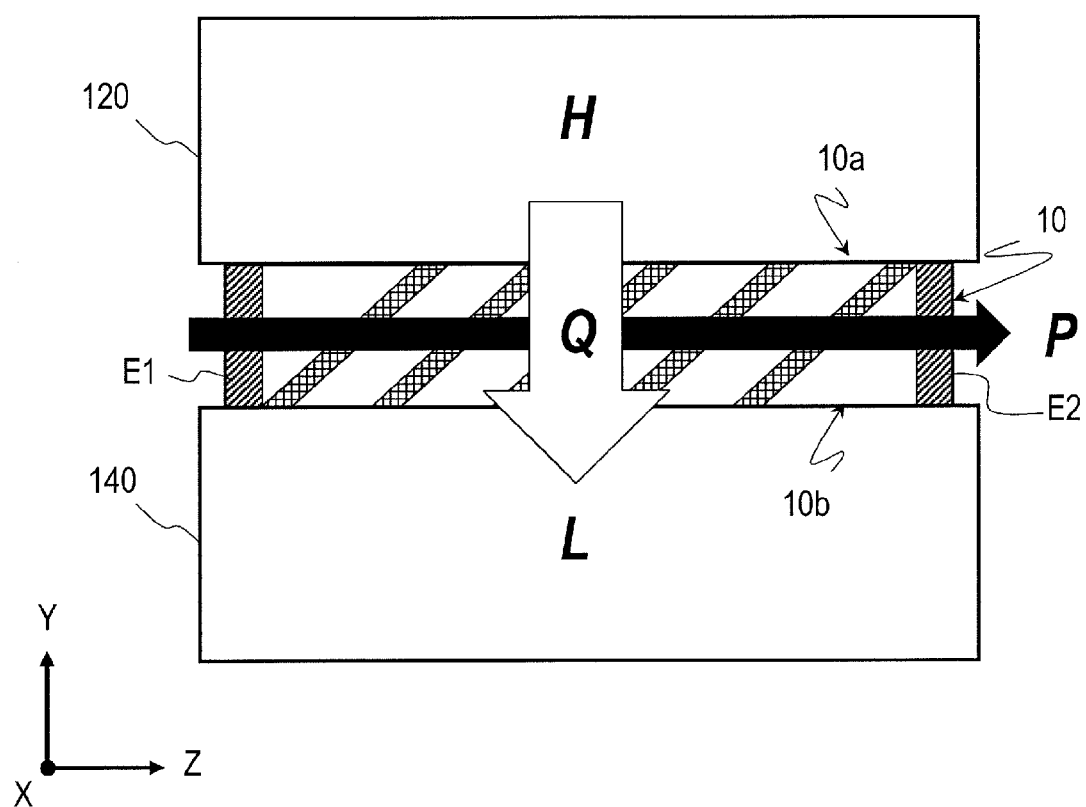
FIG. 2 schematically illustrates a situation where a high-temperature heat source 120 is brought into contact with the upper surface 10a of the thermoelectric generator 10 and a low-temperature heat source 140 is brought into contact with its lower surface 10b.

FIG. 2 schematically illustrates a situation where a high-temperature heat source 120 is brought into contact with the upper surface 10a of the thermoelectric generator 10 and a low-temperature heat source 140 is brought into contact with its lower surface 10b. In such a situation, heat Q flows from the high-temperature heat source 120 toward the low-temperature heat source 140 through the thermoelectric generator 10, and electric power P can be extracted from the thermoelectric generator 10 through the first and second electrodes E1 and E2. From a macroscopic point of view, in this thermoelectric generator 10, the direction of temperature gradient (Y-axis direction) and the direction of the electric current (Z-axis direction) intersect with each other at right angles. That is why there is no need to create a temperature difference between the two electrodes E1 and E2, through which the electric power is extracted. FIG. 2 schematically illustrates an example in which the electric power P flows from the left toward the right on the paper. However, this is only an example. For example, if the kind of the thermoelectric material used is changed, the electric power P may flow in the opposite direction from the one shown in FIG. 2.

Although the stacked body of the thermoelectric generator 10 is supposed to have a rectangular parallelepiped shape in the example described above for the sake of simplicity, a thermoelectric generator, of which the stacked body has a tubular shape, will be used in the embodiments to be described below. A thermoelectric generator in such a tubular shape will be hereinafter referred to as a "tubular thermoelectric generator" or "thermoelectric generation tube". It should be noted that in the present specification, the term "tube" is interchangeably used with the term "pipe", and is to be interpreted to encompass both a "tube" and a "pipe".

<Outline of Thermoelectric Generator Unit>

Next, a thermoelectric generator unit according to the present disclosure will be outlined.

Figure 3A:
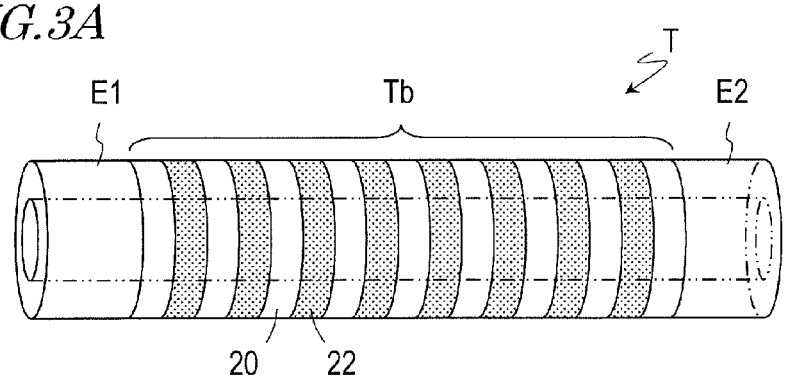
FIG. 3A is a perspective view illustrating a general configuration for a tubular thermoelectric generator T which may be used in an exemplary thermoelectric generator unit according to the present disclosure.
Figure 3B:
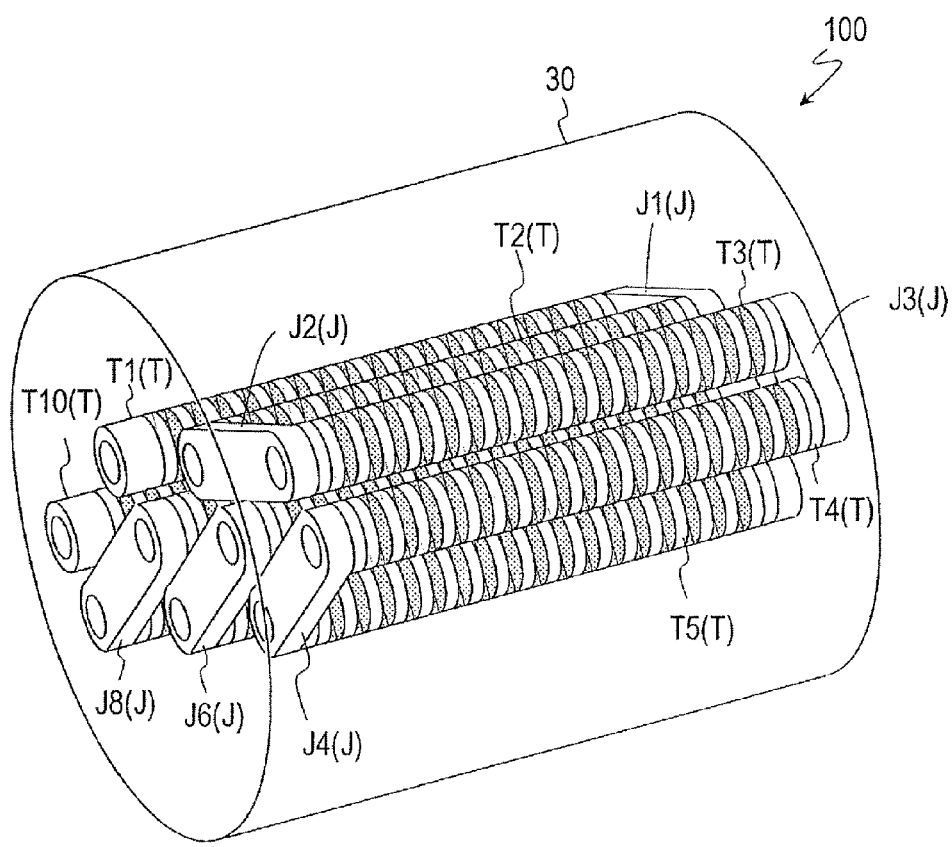
FIG. 3B is a perspective view illustrating a general configuration for an exemplary thermoelectric generator unit 100 according to the present disclosure.

First of all, look at FIGS. 3A and 3B. FIG. 3A is a perspective view illustrating an exemplary tubular thermoelectric generator T. The tubular thermoelectric generator T includes a tube body Tb in which multiple metal layers 20 and thermoelectric material layers 22 with a through hole at their center are alternately stacked one upon the other so as to be inclined and a pair of electrodes E1 and E2. A method of making such a tubular thermoelectric generator T is disclosed in Patent Document 2, for example. According to the method disclosed in Patent Document 2, multiple metallic cups, each having a hole at the bottom, and multiple thermoelectric material cups, each also having a hole at the bottom, are alternately stacked one upon the other and subjected to a plasma sintering process in such a state, thereby binding them together. The entire disclosure of PCT International Application Publication No. 2012/014366 is hereby incorporated by reference.

The tubular thermoelectric generator T shown in FIG. 3A may be connected to a conduit so that a hot heat transfer medium (such as hot water) flows through a flow path defined by its inner peripheral surface (which will sometimes be referred to as an "internal flow path" hereinbelow). In that case, the outer peripheral surface of the tubular thermoelectric generator T may be brought into contact with a cold heat transfer medium (such as cold water). In this manner, a temperature difference is created between the inner and outer peripheral surfaces of the tubular thermoelectric generator T, thereby generating a potential difference between the pair of electrodes E1 and E2. As a result, the electric power generated can be extracted. Hereinbelow, the hot heat transfer medium and the cold heat transfer medium will sometimes be simply referred to as "the hot medium" and "the cold medium", respectively.

It should be noted that although these heat transfer media will be referred to herein as "hot" and "cold" heat transfer media, these terms "hot" and "cold" actually do not refer to specific absolute temperature levels of those media but just mean that there is a relative temperature difference between those media. Also, the "medium" is typically a gas, a liquid or a fluid that is a mixture of a gas and a liquid. However, the "medium" may contain solid, e.g., powder, which is dispersed within a fluid.

The shape of the tubular thermoelectric generator T may be anything tubular, without being limited to cylindrical. In other words, when the tubular thermoelectric generator T is cut along a plane which is perpendicular to the axis of the tubular thermoelectric generator T, the resultant shapes created by sections of the "outer peripheral surface" and the "inner peripheral surface" do not need to be circles, but may be any closed curves, e.g., ellipses or polygons. Although the axis of the tubular thermoelectric generator T is typically linear, it is not limited to being linear. These can be seen easily from the principle of thermoelectric generation that has already been described with reference to FIGS. 1A, 1B and 2.

FIG. 3B is a perspective view illustrating a general configuration for an exemplary thermoelectric generator unit 100 according to the present disclosure. The thermoelectric generator unit 100 shown in FIG. 3B includes a plurality of tubular thermoelectric generators T, a container 30 which houses these tubular thermoelectric generators T inside, and a plurality of electrically conductive members J to electrically connect these tubular thermoelectric generators T together. In the example illustrated in FIG. 3B, ten tubular thermoelectric generators T1 to T10 are housed inside the container 30. Those ten tubular thermoelectric generators T1 to T10 are typically arranged substantially parallel to each other but may also be arranged in any other pattern.

Each of these tubular thermoelectric generators T1 to T10 has an outer peripheral surface, an inner peripheral surface and an internal flow path defined by the inner peripheral surface as described above. Each of these tubular thermoelectric generators T1 to T10 is configured to generate electromotive force along its axis based on a difference in temperature created between the inner and outer peripheral surfaces. That is to say, by creating a temperature difference between the outer and inner peripheral surfaces in each of those tubular thermoelectric generators T1 to T10, electric power generated can be extracted from the tubular thermoelectric generators T1 to T10. For example, by bringing a hot medium and a cold medium into contact with the internal flow path and the outer peripheral surface, respectively, in each of the tubular thermoelectric generators T1 to T10, electric power generated can be extracted from the tubular thermoelectric generators T1 to T10. Conversely, a cold medium and a hot medium may be brought into contact with the inner and outer peripheral surfaces, respectively, in each of the tubular thermoelectric generators T1 to T10.

In the example illustrated in FIG. 3B, the medium to be brought into contact with the outer peripheral surfaces of the tubular thermoelectric generators T1 to T10 inside the container 30 and the medium to be brought into contact with the inner peripheral surface of each tubular thermoelectric generator T1 to T10 in the internal flow path of the respective tubular thermoelectric generator are supplied through different conduits (not shown), thus being isolated so as not to intermix.

Figure 4:
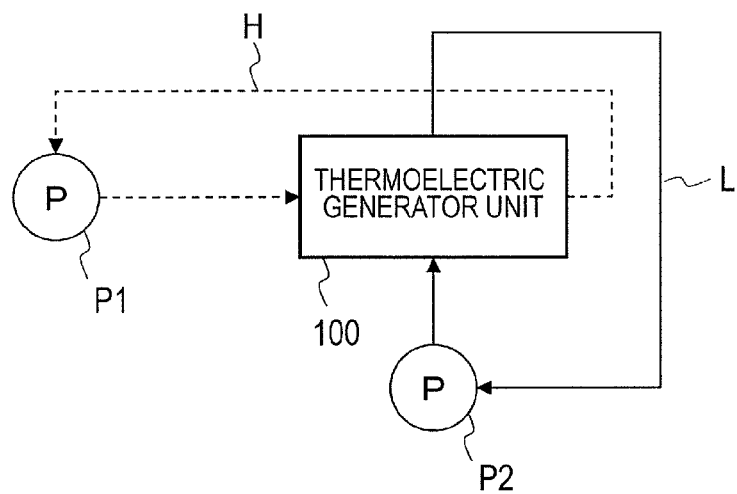
FIG. 4 is a block diagram illustrating an exemplary configuration for introducing a temperature difference between the outer and inner peripheral surfaces of the tubular thermoelectric generator T.

FIG. 4 is a block diagram illustrating an exemplary configuration for introducing a temperature difference between the outer and inner peripheral surfaces of the tubular thermoelectric generator T. In FIG. 4, the dotted arrow H schematically indicates the flow of a hot medium and the solid arrow L schematically indicates the flow of a cold medium. In the example illustrated in FIG. 4, the hot and cold media are circulated by pumps P1 and P2, respectively. For example, the hot medium may be supplied to the internal flow path in each of the tubular thermoelectric generators T1 to T10 and the cold medium may be supplied into the container 30. Although not shown in FIG. 4, heat is supplied from a high-temperature heat source (such as a heat exchanger, not shown) to the hot medium and heat is supplied from the cold medium to a low-temperature heat source (not shown, either). As the high-temperature heat source, steam, hot water and exhaust gas at relatively low temperatures (of 200 degrees Celsius or less, for example)

which have been dumped unused into the ambient can be used. Naturally, heat sources at even higher temperatures may also be used.

In the example illustrated in FIG. 4, the hot and cold media are supposed to be circulated by the pumps P1 and P2, respectively. However, this is only an example of a thermoelectric generator unit according to the present disclosure. Alternatively, one or both of the hot and cold media may be dumped from their heat source into the ambient without forming a circulating system. For example, high-temperature hot spring water that has sprung from the ground may be supplied as the hot medium to the thermoelectric generator unit 100, and when its temperature lowers, the hot spring water may be used for any purpose other than power generation or just discharged. The same can be said about the cold medium. That is to say, phreatic water, river water or seawater may be pumped up and supplied to the thermoelectric generator unit 100. After any of these kinds of water has been used as the cold medium, its temperature may be lowered to an appropriate level as needed and then the water may be either poured back to its original source or just discharged to the ambient.

Now look at FIG. 3B again. In the thermoelectric generator unit 100 according to the present disclosure, a plurality of tubular thermoelectric generators T are electrically connected together via the electrically conductive members J. In the example illustrated in FIG. 3B, each pair of tubular thermoelectric generators T arranged adjacent to each other are connected together via their associated electrically conductive member J. As a result, these tubular thermoelectric generators T are electrically connected together in series as a whole. For example, the respective right ends of two tubular thermoelectric generators T3 and T4 which are illustrated as front ones in FIG. 3B are connected together with an electrically conductive member J3. On the other hand, the respective left ends of these two tubular thermoelectric generators T3 and T4 are connected to two other tubular thermoelectric generators T2 and T5 via electrically conductive members J2 and J4, respectively.

Figure 5:
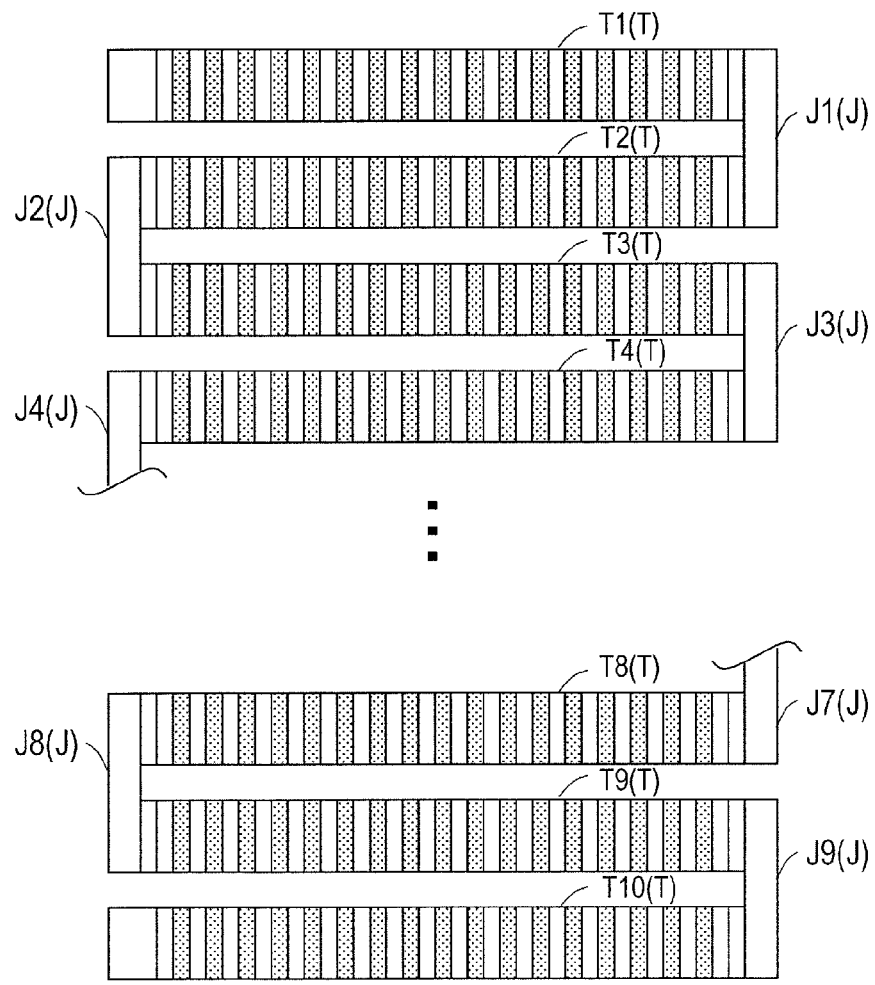
FIG. 5 schematically illustrates how the tubular thermoelectric generators T1 to T10 may be electrically connected together.

FIG. 5 schematically illustrates how those tubular thermoelectric generators T1 to T10 may be electrically connected together. As shown in FIG. 5, each of the electrically conductive members J1 to J9 electrically connects its associated two tubular thermoelectric generators together. That is to say, the electrically conductive members J1 to J9 are arranged to electrically connect these tubular thermoelectric generators T1 to T10 in series together as a whole. In this example, the circuit comprised of the tubular thermoelectric generators T1 to T10 and the electrically conductive members J1 to J9 is a traversable one. However, this circuit may also include some tubular thermoelectric generators which are connected in parallel, and it is not essential that the circuit be traversable.

In the example illustrated in FIG. 5, an electric current may flow from the tubular thermoelectric generator T1 to the tubular thermoelectric generator T10, for example. However, the electric current may also flow from the tubular thermoelectric generator T10 to the tubular thermoelectric generator T1. The direction of this electric current is determined by the kind of a thermoelectric material used to make the tubular thermoelectric generator T, the direction of flow of heat generated between the inner and outer peripheral surfaces of the tubular thermoelectric generator T, and the direction of inclination of the planes of stacking in the tubular thermoelectric generator T, for example. The connection of the tubular thermoelectric generators T1 to T10 is determined so that electromotive forces occurring in the respective tubular thermoelectric generators T1 to T10 do not cancel one another, but are superposed.

It should be noted that the direction in which the electric current flows through the tubular thermoelectric generators T1 to T10 has nothing to do with the direction in which the medium (i.e., either the hot medium or the cold medium) flows through the internal flow path of the tubular thermoelectric generators T1 to T10. For instance, in the example illustrated in FIG. 5, the medium going through the internal flow path may flow from the left toward the right on the paper in each and every one of the tubular thermoelectric generators T1 to T10.

<Detailed Configuration of Tubular Thermoelectric Generator T>

Figure 6A:
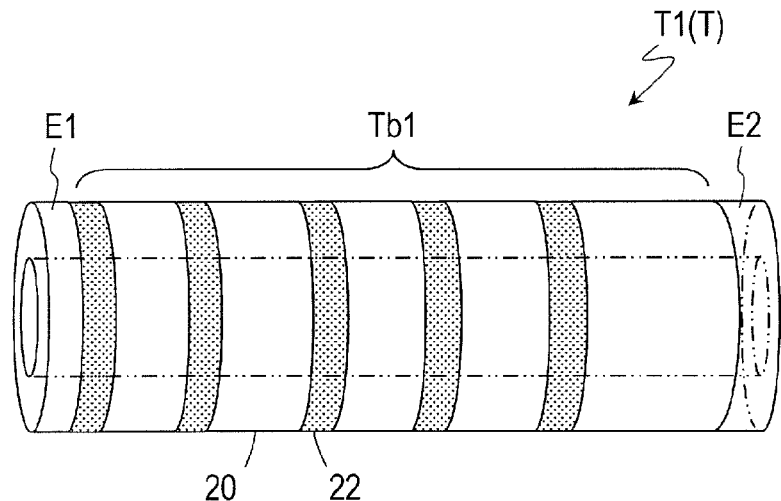
FIG. 6A is a perspective view illustrating one of the tubular thermoelectric generators T (e.g., the tubular thermoelectric generator T1 in this example) that the thermoelectric generator unit 100 has.

Next, a detailed configuration for the tubular thermoelectric generator T will be described with reference to FIGS. 6A and 6B. FIG. 6A is a perspective view illustrating one of the tubular thermoelectric generators T (e.g., the tubular thermoelectric generator T1 in this example) that the thermoelectric generator unit 100 has. The tubular thermoelectric generator T1 includes a tube body Tb1 and first and second electrodes E1 and E2 which are arranged at both ends of the tube body Tb1. The tube body Tb1 has a configuration in which multiple metal layers 20 and multiple thermoelectric material layers 22 are alternately stacked one upon the other. In the present specification, the direction in which a line that connects the first and second electrodes E1 and E2 together runs will sometimes be referred to as a "stacking direction" hereinbelow. The stacking direction agrees with the axial direction of the tubular thermoelectric generator.

Figure 6B:
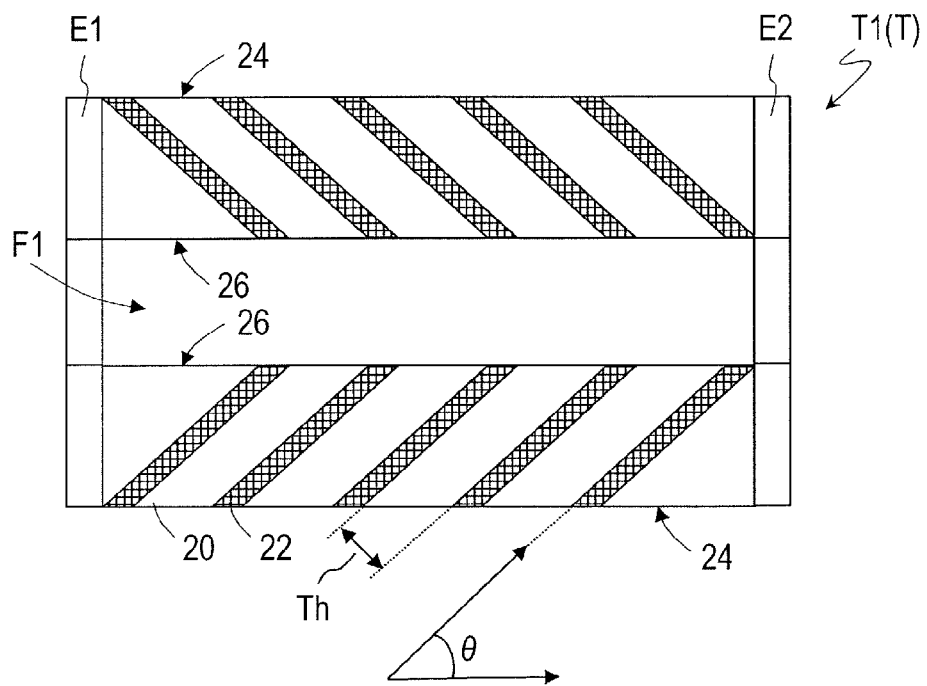
FIG. 6B schematically illustrates a cross section where the tubular thermoelectric generator T1 is cut along a plane which contains the axis (center axis) of the tubular thermoelectric generator T1.

FIG. 6B schematically illustrates a cross section of the tubular thermoelectric generator T1 as viewed on a plane including the axis (center axis) of the tubular thermoelectric generator T1. As shown in FIG. 6B, the tubular thermoelectric generator T1 has an outer peripheral surface 24 and an inner peripheral surface 26. A region which is defined by the inner peripheral surface 26 forms a flow path F1. In the illustrated example, cross sections of the outer peripheral surface 24 and the inner peripheral surface 26 taken perpendicular to the axial direction each present the shape of a circle. However, these shapes are not limited to circles, but may be ellipses or polygons, as described above. The cross-sectional area of the flow path on such a cross section that intersects with the axial direction at right angles is not particularly limited. The cross-sectional area of the flow path or the number of tubular thermoelectric generators to provide may be determined appropriately by the flow rate of the medium to be supplied into the internal flow path of the tubular thermoelectric generator T.

Although the first and second electrodes E1 and E2 each have a circular cylindrical shape in the example illustrated in FIGS. 6A and 6B, this is only an example and the first and second electrodes E1 and E2 do not have to have such a shape. At or near the respective end of the tube body Tb1, the first electrode E1 and the second electrode E2 may each have any arbitrary shape which is electrically connectable to at least one of the metal layers 20 or the thermoelectric material layers 22 and which does not obstruct the flow path F1. In the example shown in FIGS. 6A and 6B, the first electrode E1 and the second electrode E2 have outer peripheral surfaces conforming to the outer peripheral surface 24 of the tube body Tb1; however, it is not necessary for the outer peripheral surfaces of the first electrode E1 and the second electrode E2 to conform to the outer peripheral surface 24 of the tube body Tb1. For example, the diameter of the outer peripheral surface (i.e., the outer diameter) of the first and second electrodes E1 and E2 may be larger or smaller than that of the tube body Tb1. Also, when viewed on a plane that intersects with the axial direction at right angles, the cross-sectional shape of the first and second electrodes E1 and E2 may be different from that of the outer peripheral surface 24 of the tube body Tb1.

The first and second electrodes E1 and E2 may be made of a material with electrical conductivity and are typically made of a metal. The first and second electrodes E1 and E2 may be comprised of a single or multiple metal layers 20 which are located at or near the ends of the tube body Tb1. In that case, portions of the tube body Tb1 function as the first and second electrodes E1 and E2. Alternatively, the first and second electrodes E1 and E2 may also be formed out of a metal layer or annular metallic member which is arranged so as to partially cover the outer peripheral surface of the tube body Tb1. Still alternatively, the first and second electrodes E1 and E2 may also be a pair of circular cylindrical metallic members which are fitted into the flow path F1 through the ends of the tube body Tb1 so as to be in contact with the inner peripheral surface of the tube body Tb1.

As shown in FIG. 6B, the metal layers 20 and thermoelectric material layers 22 are alternately stacked one upon the other so as to be inclined. A tubular thermoelectric generator with such a configuration operates on basically the same principle as what has already been described with reference to FIGS. 1A, 1B and 2. That is why if a temperature difference is created between the outer peripheral surface 24 and inner peripheral surface 26 of the tubular thermoelectric generator T1, a potential difference is generated between the first and second electrodes E1 and E2. The general direction of the temperature gradient is the radial direction of the tubular thermoelectric generator T1 (i.e., the direction that intersects with the stacking direction at right angles).

The inclination angle θ of the planes of stacking in the tube body Tb1 may be set within the range of not less than 5 degrees and not more than 60 degrees, for example. The inclination angle θ may be not less than 20 degrees and not more than 45 degrees. An appropriate range of the inclination angle θ varies according to the combination of the material to make the metal layers 20 and the thermoelectric material to make the thermoelectric material layers 22.

The ratio of the thickness of each metal layer 20 to that of each thermoelectric material layer 22 in the tube body Tb1 (which will be hereinafter simply referred to as a "stacking ratio") may be set within the range of 20:1 to 1:9, for example. In this case, the thickness of the metal layer 20 refers herein to its thickness as measured perpendicularly to the plane of stacking (i.e., the thickness indicated by the arrow Th in FIG. 6B). In the same way, the thickness of the thermoelectric material layer 22 refers herein to its thickness as measured perpendicularly to the plane of stacking. It should be noted that the total number of the metal layers 20 and thermoelectric material layers 22 that are stacked one upon the other may be set appropriately.

The metal layers 20 may be made of any arbitrary metallic material. For example, the metal layers 20 may be made of nickel or cobalt. Nickel and cobalt are examples of metallic materials which exhibit excellent thermoelectric generation properties. Optionally, the metal layers 20 may include silver or gold. Furthermore, the metal layers 20 may include any of these metallic materials either by itself or as their alloy. If the metal layers 20 are made of an alloy, the alloy may include copper, chromium or aluminum. Examples of such alloys include constantan, CHROMEL™, and ALUMEL™.

The thermoelectric material layers 22 may be made of any arbitrary thermoelectric material depending on their operating temperature. Examples of thermoelectric materials which may be used to make the thermoelectric material layers include: thermoelectric materials of a single element, such as bismuth or antimony; alloy-type thermoelectric materials, such as BiTe-type, PbTe-type and SiGe-type; and oxide-type thermoelectric materials, such as $Ca_xCoO_2$, $Na_x\text{-}CoO_2$ and $SrTiO_3$. In the present specification, the "thermoelectric material" refers herein to a material, of which the Seebeck coefficient has an absolute value of 30 μV/K or more and the electrical resistivity is 10 mΩcm or less. Such a thermoelectric material may be a crystalline one or an amorphous one. If the hot medium has a temperature of approximately 200 degrees Celsius or less, the thermoelectric material layers 22 may be made of a dense body of bismuth-antimony-tellurium, for example. Bismuth-antimony-tellurium may be, but does not have to be, represented by a chemical composition $Bi_{0.5}Sb_{1.5}Te_3$. Optionally, bismuth-antimony-tellurium may include a dopant such as selenium. The mole fractions of bismuth and antimony may be adjusted appropriately.

Other examples of the thermoelectric materials to make the thermoelectric material layers 22 include bismuth telluride and lead telluride. When the thermoelectric material layers 22 are made of bismuth telluride, it may be of the chemical composition $Bi_2Te_X$, where $2<X<4$. A representative chemical composition of bismuth telluride is $Bi_2Te_3$, which may include antimony or selenium. The chemical composition of bismuth telluride including antimony may be represented by $(Bi_{1-Y}Sb_Y)_2Te_X$, where $0<Y<1$, and more preferably $0.6<Y<0.9$.

The first and second electrodes E1 and E2 may be made of any material as long as the material has good electrical conductivity. For example, the first and second electrodes E1 and E2 may be made of a metal selected from the group consisting of nickel, copper, silver, molybdenum, tungsten, aluminum, titanium, chromium, gold, platinum and indium. Alternatively, the first and second electrodes E1 and E2 may also be made of a nitrides or oxides, such as titanium nitride (TiN), indium tin oxide (ITO), and tin dioxide ($SnO_2$). Still alternatively, the first or second electrode E1, E2 may also be made of solder, silver solder or electrically conductive paste, for example. It should be noted that if both ends of the tube body Tb1 are metal layers 20, then the first and second electrodes E1 and E2 may be replaced with those metal layers 20 as described above.

In the foregoing description, an element with a configuration in which metal layers and thermoelectric material layers are alternately stacked one upon the other has been described as a typical example of a tubular thermoelectric generator. However, this is just an example, and the tubular thermoelectric generator which may be used according to the present disclosure does not have to have such a configuration. Rather electrical power can also be generated thermoelectrically as described above as long as a first layer made of a first material with a relatively low Seebeck coefficient and relatively high thermal conductivity and a second layer made of a second material with a relatively high Seebeck coefficient and relatively low thermal conductivity are stacked alternately one upon the other. That is to say, the metal layer 20 and thermoelectric material layer 22 are only examples of such first and second layers, respectively.

<Embodiment of Thermoelectric Generator Unit>

Figure 7A:
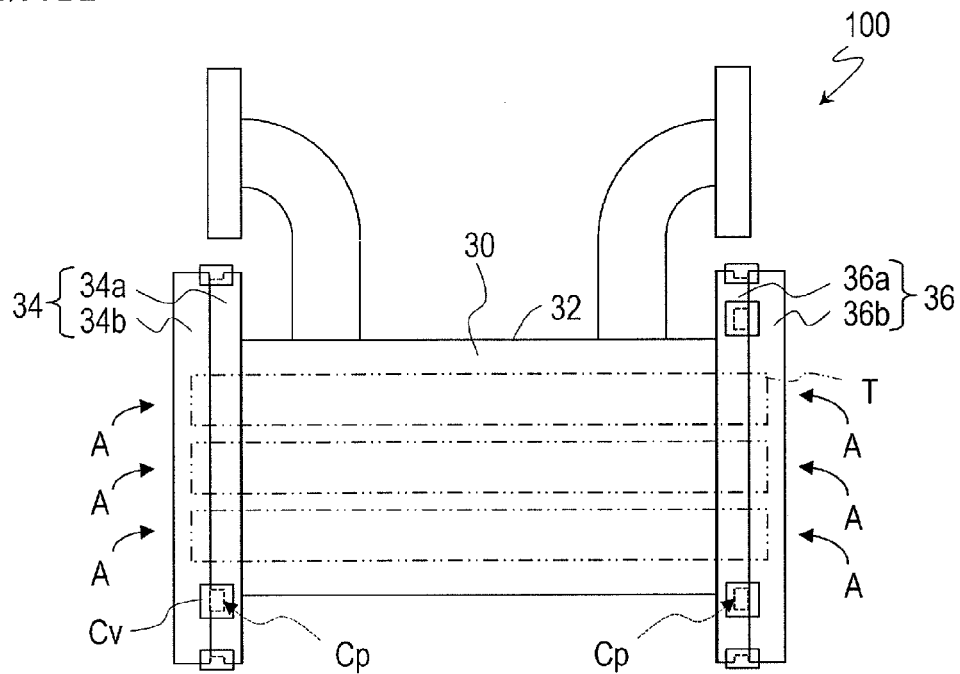
FIG. 7A is a front view illustrating an implementation of a thermoelectric generator unit according to the present disclosure.
Figure 7B:
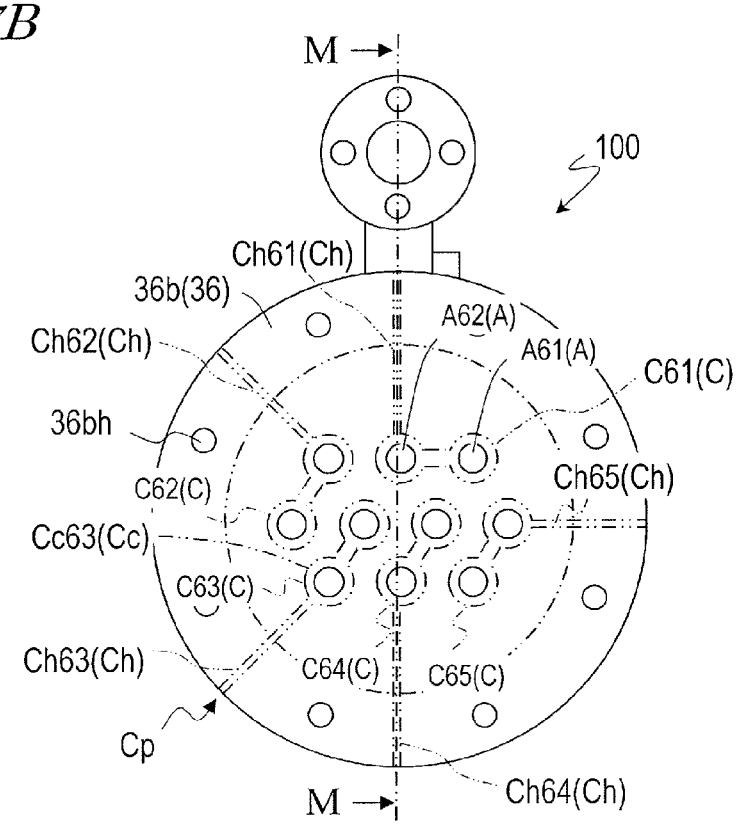
FIG. 7B illustrates one of the side faces of the thermoelectric generator unit 100 (a right side view in this case).

Next, look at FIGS. 7A and 7B. FIG. 7A is a front view illustrating an exemplary thermoelectric generator unit according to an embodiment of the present disclosure. FIG. 7B illustrates one of the side faces of the thermoelectric generator unit 100 (a right side view in this case). As shown in FIG. 7A, the thermoelectric generator unit 100 according to this implementation includes a number of tubular thermoelectric generators T and a container 30 which houses those tubular thermoelectric generators T inside. At a glance, such a structure looks like the "shell and tube structure" of a heat exchanger. In a heat exchanger, however, a number of tubes just function as pipelines to make fluid flow through and do not have to be electrically connected together. In a thermoelectric generator unit according to the present disclosure, on the other hand, those tubular thermoelectric generators need to be electrically connected together in practice with good stability, unlike the heat exchanger.

As already described with reference to FIG. 4, a hot medium and a cold medium are supplied to the thermoelectric generator unit 100. The hot medium may be supplied into the respective internal flow paths of the tubular thermoelectric generators T1 to T10 through multiple openings A, for example. Meanwhile, the cold medium is supplied into the container 30 through a fluid inlet port to be described later. As a result, a temperature difference is created between the outer and inner peripheral surfaces of each tubular thermoelectric generator T. In this case, in the thermoelectric generator unit 100, not only heat is exchanged between the hot and cold media but also electromotive force occurs in the axial direction in each of the tubular thermoelectric generators T1 to T10.

In this embodiment, the container 30 includes a cylindrical shell 32 which surrounds the tubular thermoelectric generators T and a pair of plates 34 and 36 which are arranged to close the open ends of the shell 32. More specifically, in the example shown in FIG. 7A, the plates 34 and 36 are respectively fixed onto the left and right ends of the shell 32. Each of these plates 34 and 36 has multiple openings A into which respective tubular thermoelectric generators T are inserted. Both ends of an associated tubular thermoelectric generator T are inserted into each corresponding pair of openings A of the plates 34 and 36.

Just like the tube sheets of a shell and tube heat exchanger, these plates 34 and 36 have the function of supporting a plurality of tubes (i.e., the tubular thermoelectric generators T) so that these tubes are spatially separated from each other. As will be described in detail later, the plates 34 and 36 have an electrical connection capability that the tube sheets of a heat exchanger do not have.

Also, in the exemplary configuration shown in FIGS. 7A and 7B, a plurality of openings Cp are cut through the side peripheral surface of the pair of plates 34 and 36, each of which has a disc shape in this example. Each of those openings Cp exposes the testing hole portion Ch of the channel C (to be described later) to the outside space. Each of the openings Cp may function as a port into which a voltage probe is inserted, for example.

Each of those openings Cp may be always open. Alternatively, to prevent water, oil, or dust from entering the testing hole portion Ch of the channel C, an openable/closable cap Cv (not shown in FIG. 7B, see FIG. 7A) may be arranged in the vicinity of each opening Cp. Or the cap Cv may be replaced with an openable/closable shutter which is arranged inside of the plate. Into each opening Cp, a removable plug made of rubber, metal, or plastic may be inserted. If the opening Cp has a thread portion, the plug may be a screw having a thread portion that engages with the thread portion of the opening Cp. It should be noted that the number and arrangement of the openings Cp shown in FIGS. 7A and 7B are just an example. The number of the openings Cp to provide may be changed according to the number of the tubular thermoelectric generators T housed in the container 30, for example. On the drawings other than FIG. 7A, illustration of the cap Cv is omitted.

In the example illustrated in FIG. 7A, the plate 34 includes a first plate portion 34a fixed to the shell 32 and a second plate portion 34b which is attached to the first plate portion 34a so as to be readily removable from the first plate portion 34a. Likewise, the plate 36 also includes a first plate portion 36a fixed to the shell 32 and a second plate portion 36b which is attached to the first plate portion 36a so as to be readily removable from the first plate portion 36a. The openings A in the plates 34 and 36 penetrate through, respectively, the first plate portions 34a and 36a and the second plate portions 34b and 36b, thus leaving the flow paths of the thermoelectric generation tubes T open to the exterior of the container 30.

Examples of materials to make the container 30 include metals such as stainless steel, HASTELLOY™ or INCONEL™. Examples of other materials to make the container 30 include polyvinyl chloride and acrylic resin. The shell 32 and the plates 34, 36 may be made of the same material or may be made of two different materials. If the shell 32 and the first plate portions 34a and 36a are made of metal(s), then the first plate portions 34a and 36a may be welded onto the shell 32. Or if flanges are provided at both ends of the shell 32, the first plate portions 34a and 36a may be fixed onto those flange portions.

Since some fluid (that is either the cold medium or hot medium) is introduced into the container 30 while the thermoelectric generator unit 100 is operating, the inside of the container 30 should be kept either airtight or watertight. As will be described later, each opening A of the plates 34, 36 is sealed to keep the inside of the container 30 either airtight or watertight once the ends of the tubular thermoelectric generator T have been inserted through the opening A. A structure in which no gap is left between the shell 32 and the plates 34, 36 and which is kept either airtight or watertight throughout the operation is realized.

As shown in FIG. 7B, in this example, ten openings A have been cut through the plate 36. Likewise, ten openings A have also been cut through the other plate 34. In the example illustrated in FIG. 7A, each opening A of the plate 34 and its associated opening A of the plate 36 are arranged mirror-symmetrically to each other, and ten lines which connect together the respective center points of ten pairs of associated openings A are parallel to each other. According to such a configuration, the respective tubular thermoelectric generators T may be supported parallel to each other through the pairs of associated openings A. Nevertheless, those tubular thermoelectric generators T do not have to be arranged parallel to each other but may also be arranged either non-parallel or skew to each other.

As shown in FIG. 7B, the plate 36 has channels C, each of which has been formed to connect together at least two of the openings A cut through the plate 36. In the example illustrated in FIG. 7B, the channel C61 connects together openings A61 and A62. Each of the other channels C62 to C65 also connects together two associated ones of the openings A in the plate 36. In the present specification, the portion of the plate that connects together at least two of the openings A will sometimes be referred to as an "interconnection" hereinbelow. As will be described later, an electrically conductive member is housed in each of these channels C61 to C65.

The channels C61 to C65 shown in FIG. 7B respectively have testing hole portions Ch61 to Ch65 which run from the interconnections through the outer edge of the plate 36. For example, a testing hole portion Ch63 is provided for the channel C63 so as to run straight from the interconnection Cc63 through the outer edge of the plate 36. Each of these testing hole portions Ch may be bent inside the plate. For example, the testing hole portion Ch may be folded or curved inside of the plate. When viewed on a plane which intersects with the direction in which the testing hole portion Ch runs at right angles, the testing hole portion Ch may have any cross-sectional shape. The cross-sectional shape of the testing hole portion Ch does not have to be uniform inside the plate and its cross-sectional area does not have to be constant inside the plate, either. For example, the cross-sectional area of the testing hole portion Ch may decrease gradually from the outer edge of the plate 36 toward the interconnection.

Figure 8:
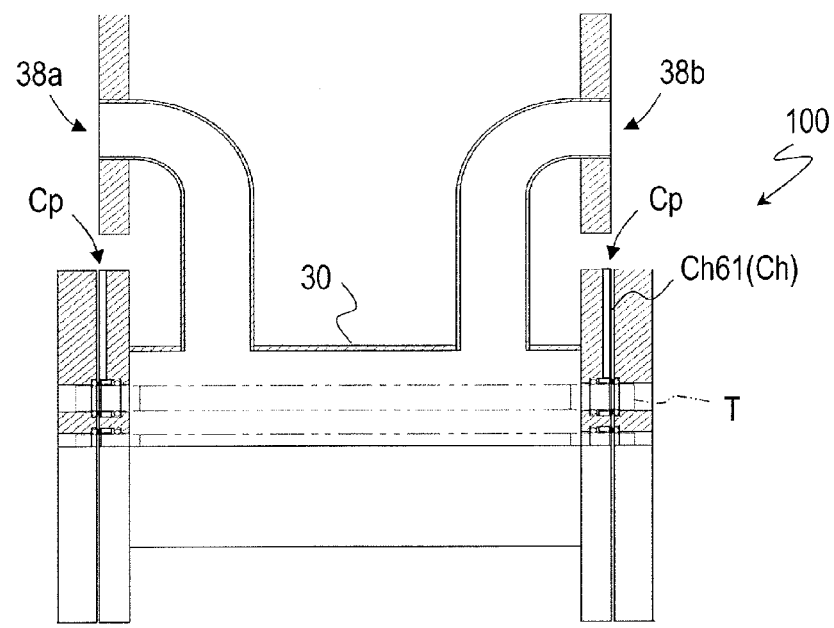
FIG. 8 illustrates a portion of a cross section of the thermoelectric generator unit 100 as viewed on the plane M-M shown in FIG. 7B.

FIG. 8 illustrates a portion of a cross section of the thermoelectric generator unit 100 as viewed on the plane M-M shown in FIG. 7B. It should be noted that in FIG. 8, a cross section of the lower half of the container 30 is not shown but its front portion is shown instead. As shown in FIG. 8, the container 30 has a fluid inlet port 38a and a fluid outlet port 38b through which a fluid flows inside the container 30. In this thermoelectric generator unit 100, the fluid inlet and outlet ports 38a and 38b are arranged in the upper part of the container 30. However, the fluid inlet port 38a does not have to be arranged in the upper part of the container 30 but may also be arranged in the lower part of the container 30 as well. The same can be said about the fluid outlet port 38b. The fluid inlet and outlet ports 38a and 38b do not always have to be used as inlet and outlet for a fluid but may be inverted at regular or irregular intervals. That is to say, the fluid flowing direction does not have to be fixed. Also, although only one fluid inlet port 38a and only one fluid outlet port 38b are shown in FIG. 8, this is only an example, and more than one fluid inlet port 38a and/or more than one fluid outlet port 38b may be provided as well.

Figure 9:
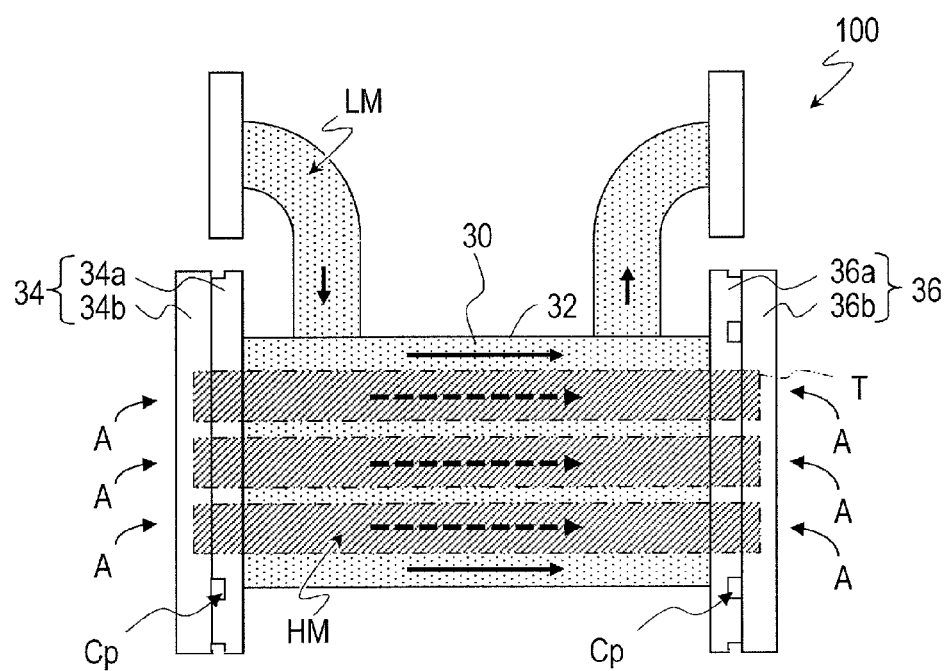
FIG. 9 Schematically shows exemplary flow directions of the hot and cold media introduced into the thermoelectric generator unit.

FIG. 9 schematically shows exemplary flow directions of the hot and cold media introduced into the thermoelectric generator unit 100. In the example shown in FIG. 9, a hot medium HM is supplied into the internal flow path of each of the tubular thermoelectric generators T1 to T10, while a cold medium LM is supplied into the container 30. In this example, the hot medium HM is introduced into the internal flow path of each tubular thermoelectric generator through the openings A cut through the plate 34. The hot medium HM introduced into the internal flow path of each tubular thermoelectric generator contacts with the inner peripheral surface of the tubular thermoelectric generator. On the other hand, the cold medium LM is introduced into the container 30 through the fluid inlet port 38a. The cold medium LM introduced into the container 30 contacts with the outer peripheral surface of each tubular thermoelectric generator.

In the example shown in FIG. 9, while flowing through the internal flow path of each tubular thermoelectric generator, the hot medium HM exchanges heat with the cold medium LM. The hot medium HM, of which the temperature has decreased through heat exchange with the cold medium LM, is discharged out of the thermoelectric generator unit 100 through the openings A of the plate 36. On the other hand, while flowing inside the container 30, the cold medium LM exchanges heat with the hot medium HM. The cold medium LM, of which the temperature has increased through heat exchange with the hot medium HM, is discharged out of the thermoelectric generator unit 100 through the fluid outlet port 38b. The flow directions of the hot and cold media HM and LM shown in FIG. 9 are only an example. One or both of the hot and cold media HM and LM may flow from the right to the left on the paper.

In one implementation, the hot medium HM (e.g., hot water) may be introduced into the flow path of each tubular thermoelectric generator T, and the cold medium LM (e.g., cooling water) may be introduced through the fluid inlet port 38a to fill the inside of the container 30 with the cold medium LM. Conversely, the cold medium LM (e.g., cooling water) may be introduced into the flow path of each tubular thermoelectric generator T, and the hot medium HM (e.g., hot water) may be introduced through the fluid inlet port 38a to fill the inside of the container 30 with the hot medium HM. In this manner, a temperature difference which is large enough to generate electric power can be created between the outer and inner peripheral surfaces 24 and 26 of each tubular thermoelectric generator T.

<Implementations of Electrical Connection Between Tubular Thermoelectric Generators>

Figure 10:
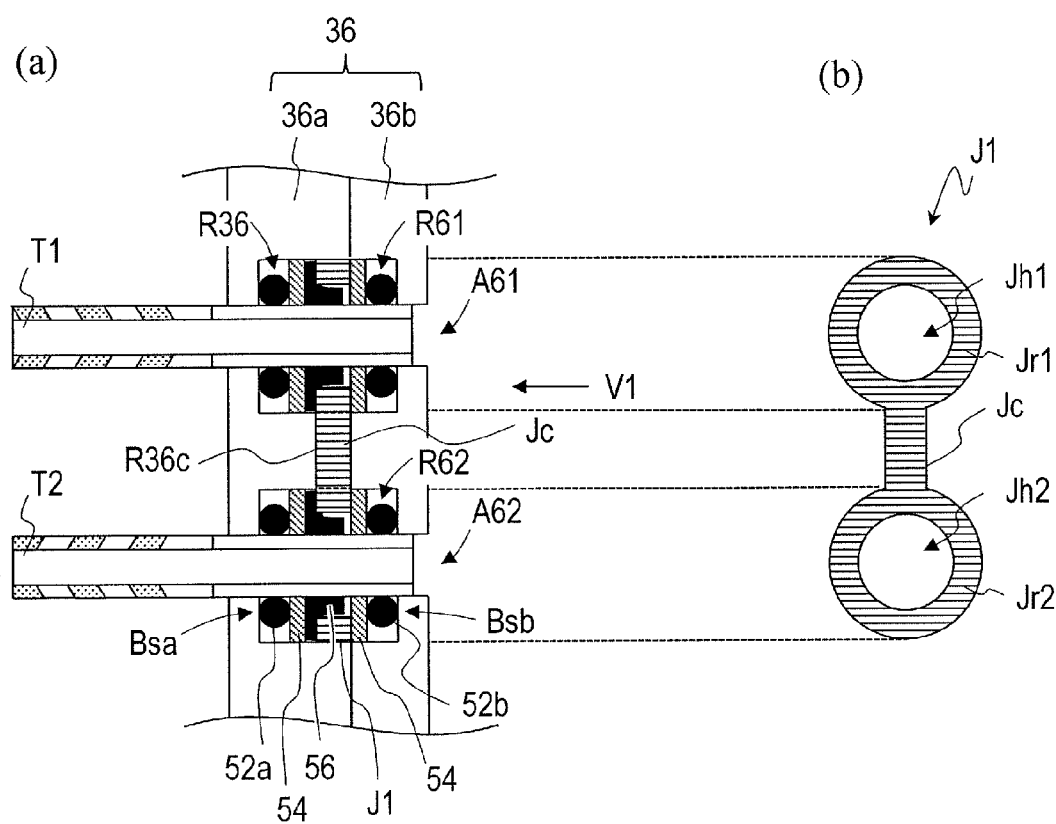
FIG. 10 schematically illustrates a cross section of a portion of a plate 36 and the appearance of an electrically conductive member J1.

Portion (a) of FIG. 10 schematically illustrates a partial cross-sectional view of the plate 36. Specifically, portion (a) of FIG. 10 schematically illustrates a cross section of the plate 36 as viewed on a plane including the respective center axes of both of two tubular thermoelectric generators T1 and T2. More specifically, portion (a) of FIG. 10 illustrates the structure of openings A61 and A62 of multiple openings A that the plate 36 has and a region surrounding them. Portion (b) of FIG. 10 schematically illustrates the appearance of an electrically conductive member J1 as viewed in the direction indicated by the arrow V1 in portion (a) of FIG. 10. This electrically conductive member J1 has two through holes Jh1 and Jh2. In detail, this electrically conductive member J1 includes a first ring portion Jr1 with the through hole Jh1, a second ring portion Jr2 with the through hole Jh2, and a connecting portion Jc to connect these two ring portions Jr1 and Jr2 together.

As shown in portion (a) of FIG. 10, one end of the tubular thermoelectric generator T1 (on the second electrode side) is inserted into the opening A61 of the plate 36 and one end of the tubular thermoelectric generator T2 (on the first electrode side) is inserted into the opening A62. In this state, those ends of the tubular thermoelectric generators T1 and T2 are respectively inserted into the through holes Jh1 and Jh2 of the electrically conductive member J1. That end of the tubular thermoelectric generator T1 (on the second electrode side) and that of the tubular thermoelectric generator T2 (on the first electrode side) are electrically connected together via this electrically conductive member J1. In the present specification, an electrically conductive member to connect two tubular thermoelectric generators electrically together will be hereinafter referred to as a "connection plate".

It should be noted that the first and second ring portions Jr1 and Jr2 do not have to have an annular shape. As long as electrical connection is established between the tubular thermoelectric generators, the through hole Jh1 or Jh2 may also have a circular, elliptical or polygonal shape as well. For example, the shape of the through hole Jh1 or Jh2 may be different from the cross-sectional shape of the first or second electrode E1 or E2 as viewed on a plane that intersects with the axial direction at right angles. In the present specification, the "ring" shape includes not only an annular shape but other shapes as well.

In the example illustrated in portion (a) of FIG. 10, the first plate portion 36a has a recess R36 which has been cut for the openings A61 and A62. This recess R36 includes a groove portion R36c to connect the openings A61 and A62 together. The connecting portion Jc of the electrically conductive member J1 is located in this groove portion R36c. On the other hand, recesses R61 and R62 have been cut in the second plate portion 36b for the openings A61 and A62, respectively. In this example, various members to establish sealing and electrical connection are arranged inside the space formed by these recesses R36, R61 and R62. That space forms the interconnection of a channel C61 to house the electrically conductive member J1 and the openings A61 and A62 are connected together via the interconnection of the channel C61. It should be noted that a testing hole portion Ch61 (not shown) is extended in the direction coming out of the paper from the space in which the second ring portion Jr2 of the electrically conductive member J2 is arranged.

<Testing Hole Portion>

Figure 11A:
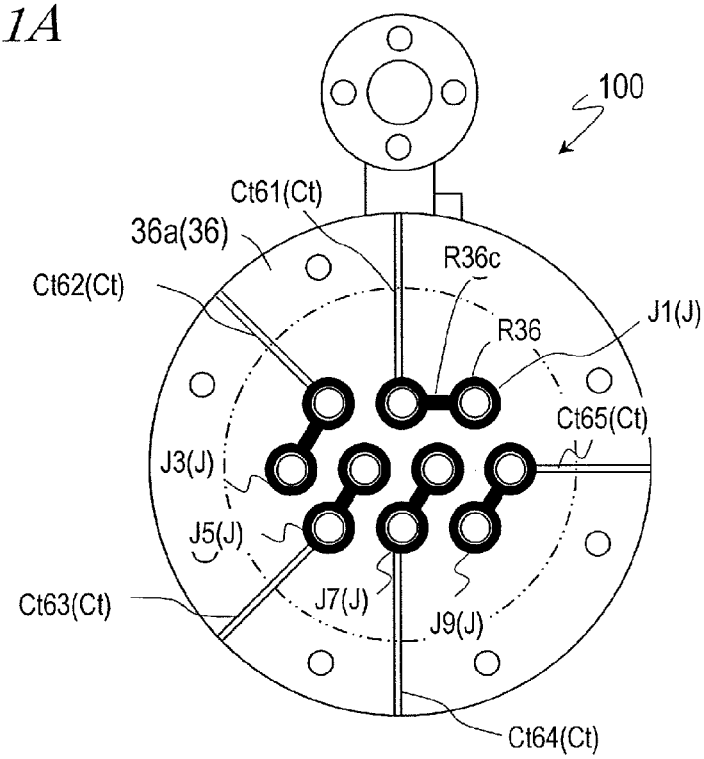
FIG. 11A illustrates a first plate portion 36a as viewed in the direction indicated by the arrow V1 in portion (a) of FIG. 10.

FIG. 11A illustrates a first plate portion 36a as viewed in the direction indicated by the arrow V1 in portion (a) of FIG. 10. As shown in FIG. 11A, the electrically conductive members J can be arranged in the recesses that have been cut in the first plate portion 36a. That is why by fastening the first and second plate portions 36a and 36b together, the electrically conductive members J will be housed in the associated interconnections of the channels C.

As shown in FIG. 11A, the sealing surface of the first plate portion 36a (i.e., the surface that faces the second plate portion 36b) may have groove portions Ct which connect with the recesses. In the exemplary configuration shown in FIG. 11A, the sealing surface of the first plate portion 36a has groove portions Ct61 to Ct65, which respectively run from the recesses where the electrically conductive members J1, J3, J5, J7 and J9 are arranged through the outer edge of the first plate portion 36a. By fastening the first and second plate portions 36a and 36b together, the testing hole portions Ch shown in FIG. 7B may be formed by the groove portions Ct of the first plate portion 36a and the sealing surface of the second plate portion 36b (i.e., the surface that faces the first plate portion 36a). In that case, the surface of the groove portions Ct of the first plate portion 36a forms part of the inner peripheral surface of the testing hole portions Ch. Those groove portions Ct running through the outer edge of the plate 36 may be cut on at least one of the first and second plate portions 36a and 36b. Optionally, the testing hole portions Ch may also be formed by cutting the groove portions Ct on both of the first and second plate portions 36a and 36b.

As described above, the testing hole portion Ch of each channel reaches the outer edge of the plate 36. Thus, a probe for testing the tubular thermoelectric generators T can be inserted through an opening Cp that has been cut through the outer edge of the plate 36. That is to say, the testing hole portion Ch can function as a slot into which the probe is inserted. As a result, the tip end of the probe can be brought into contact with the electrically conductive member J arranged in the plate 36 through the testing hole portion Ch.

In this case, the ends of the tubular thermoelectric generators T are inserted into the through holes of each electrically conductive member J. The electrically conductive member J and the tubular thermoelectric generators T are electrically connected together, e.g., via the electrically conductive ring members 56 to be described later. The electrically conductive ring members 56 are typically made of a metal and can thermally couple the electrically conductive member J and the tubular thermoelectric generators T together. That is why by bringing a tip end of the probe into contact with the electrically conductive member J arranged in the plate 36, electrical or thermal information about the electrically conductive member J housed in the channel C can be retrieved out of this thermoelectric generator unit 100.

Examples of the electrical information about the electrically conductive member J include a potential difference, electric current or electric power which has been created or generated between two arbitrary electrically conductive members J or between a certain reference point and an arbitrary electrically conductive member J. On the other hand, typical example of the thermal information about the electrically conductive member J is temperature. The potential difference, electric current and electric power can be measured with a tester, a voltmeter, an ammeter, a digital multi-meter, a source-measurement unit, a data acquisition (DAQ) unit, an electronic load or any other general instrument. The temperature may be measured with a general instrument by bringing a probe such as a thermocouple or a resistance thermometer into contact with a point of measurement.

While the thermoelectric generator unit 100 is operating, some failure (such as creation of cracks or bores in the tube body Tb) may occur accidentally under harsh operation conditions in any of the tubular thermoelectric generators T. In such a situation, the expected voltage cannot be obtained from the tubular thermoelectric generator T in which the failure has occurred. That is why by getting electrical information from the electrically conductive members J, decision can be made what tubular thermoelectric generator T has caused the failure. Any failure that has occurred in a tubular thermoelectric generator T can be detected as an increase in the resistance of that tubular thermoelectric generator T, for example. Also, if the hot and cold media that have been introduced into the thermoelectric generator unit 100 have been mixed together inside of the container 30 due to creation of cracks or bores in the tube body Tb, occurrence of such a failure can be detected by measuring the temperatures of the electrically conductive members J.

This thermoelectric generator unit 100 can seal the channels C from the fluids (hot and cold media) as will be described later. That is why decision can be made, without stopping operating the thermoelectric generator unit 100, what tubular thermoelectric generator T has caused the failure.

Figure 11B:
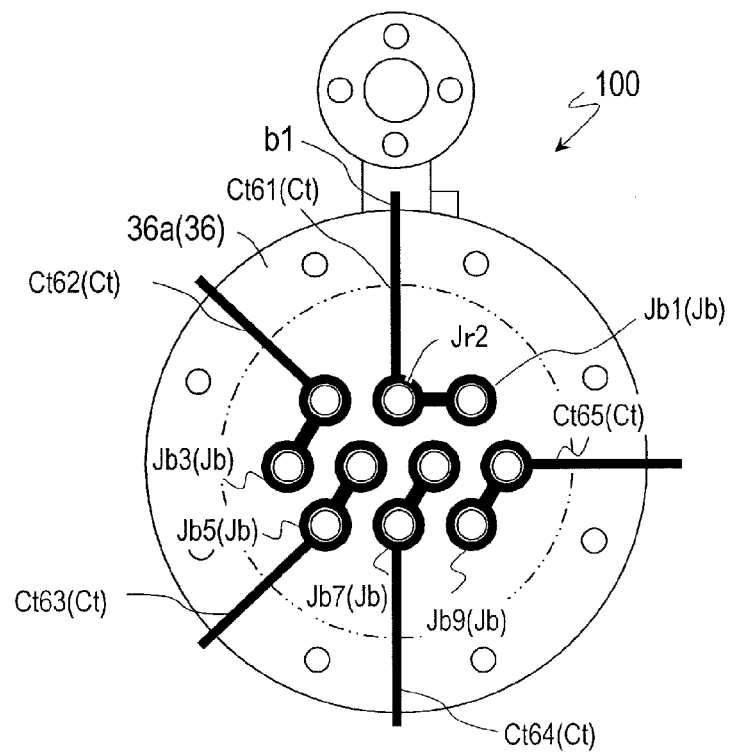
FIG. 11B illustrates another exemplary configuration for retrieving electrical or thermal information about the electrically conductive members out of the thermoelectric generator unit 100.

FIG. 11B illustrates another exemplary configuration for retrieving electrical or thermal information about the electrically conductive members out of the thermoelectric generator unit 100. In the example illustrated in FIG. 11B, each of the electrically conductive members Jb1, Jb3, Jb5, Jb7, and Jb9 has a branch extended toward the outer edge of the plate 36. Each of these branches has such a shape as matching its associated groove portion Ct on the first plate portion 36a and has been fitted into the associated groove portion Ct. In the example shown in FIG. 11B, the electrically conductive member Jb1 has a branch b1 running from the second ring portion Jr2 toward the outer edge of the plate 36, for example. In one implementation, the end of this branch b1 sticks out of the plate 36. That is to say, the end of this branch b1 sticks out of the plate 36 through the testing hole portion Ch61. In this example, electrical or thermal information about the electrically conductive member Jb1 can be retrieved out of the thermoelectric generator unit 100 through the end of the branch b1. In the example shown in FIG. 11B, a portion of the electrically conductive member Jb (i.e., its branch) protrudes out of the interconnection. In the present specification, even if an electrically conductive member is "housed" in an interconnection, the profile of the electrically conductive member may not match the shape of the interconnection in this manner.

The end of the branch does not have to stick out of the plate but may be located inside of the plate. If the end of the branch is located inside of the plate, the tip end of a probe can reach the electrically conductive member (i.e., the tip end of its branch) easily even in a situation where there is a long distance from the outer edge of the plate to the interconnection (i.e., even when the slot is deep). Consequently, a relatively short probe may be used in that case.

Figure 12A:
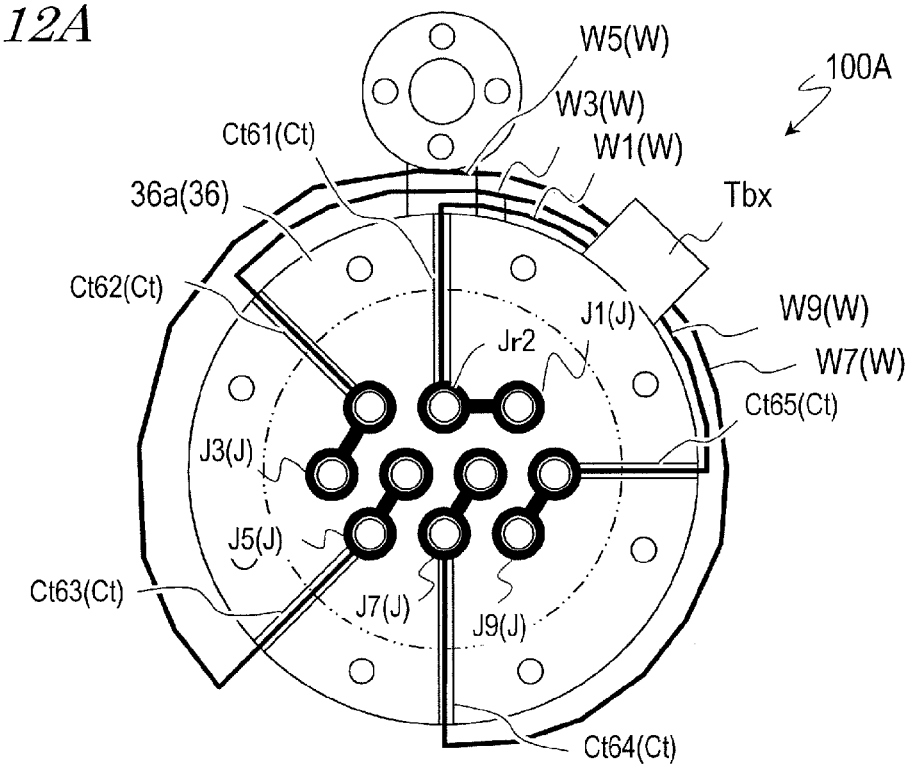
FIG. 12A illustrates still another exemplary configuration for retrieving electrical or thermal information about the electrically conductive members J out of the thermoelectric generator unit.
Figure 12B:
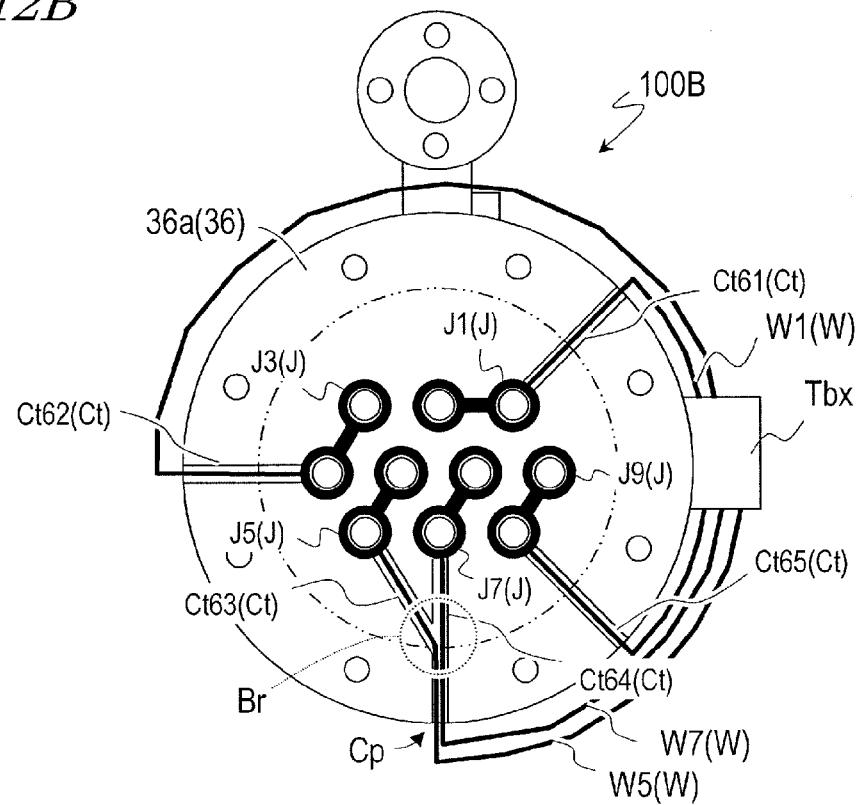
FIG. 12B illustrates yet another exemplary configuration for retrieving electrical or thermal information about the electrically conductive members J out of the thermoelectric generator unit.

FIGS. 12A and 12B illustrate still other exemplary configurations for retrieving electrical or thermal information about the electrically conductive members J out of the thermoelectric generator unit 100. In the exemplary configuration shown in FIG. 12A, a wire W is connected to each electrically conductive member J. Each of these wires W1, W3, W5, W7, and W9 has its one end electrically connected to its associated connection plate J and has the other end thereof extended out of the plate 36 through its associated testing hole portion Ch. If each electrically conductive member has a branch and if the end of the branch is located inside of the plate, one end of the wire W may be connected to the end of the branch with solder, for example. The portion of the wire W extended out of the plate 36 may be arranged along the outer edge of the plate 36. The wire W typically has flexibility. In the present specification, examples of the "wire" include cords, cables and a bare metal line with no insulation jacket.

The thermoelectric generator unit 100A shown in FIG. 12A includes a terminal box Tbx, in which the wires W extended out of the plate 36 are aggregated together. The terminal box Tbx has a plurality of terminals, to each of which an associated one of the wires W extended out of the plate 36 is connected. Thus, each of the plurality of terminals is electrically connected to an associated one of the electrically conductive members J through the testing hole portion Ch. The terminal box Tbx may be arranged at the outer edge of the plate 36, for example. However, the terminal box Tbx may also be arranged at any arbitrary position and may be arranged on the side surface (side peripheral surface) of the shell 32, for example. The terminal box Tbx may even be arranged distant from the location where the thermoelectric generator unit 100A is arranged. By aggregating such wires each of which is connected to an associated one of the electrically conductive members J, in the terminal box Tbx, electrical information about the electrically conductive members J can be collected even more easily.

The testing hole portion Ch may have a ramified portion inside of the plate 36. In the thermoelectric generator unit 100B shown in FIG. 12B, two groove portions Ct63 and Ct64 of the first plate portion 36a are joined together at a ramified portion Br inside the plate 36. Also, a wire W5, one end of which is connected to the electrically conductive member J5, and a wire W7, one end of which is connected to the electrically conductive member J7, are extended out of the plate 36 through the same opening. As can be seen, if a testing hole portion Ch has such a ramified portion Br inside of the plate 36, the layout of the wires between the electrically conductive members J and the terminal box Tbx can be simplified.

In the exemplary configurations shown in FIGS. 11A, 11B, 12A and 12B, each testing hole portion Ch (or groove portion Ct) runs straight from the interconnection through the outer edge of the plate 36. However, the testing hole portion Ch may also wind inside of the plate 36. For example, if groove portions Ct are formed so as to draw curves inside of the plate 36, the openings Cp to expose the testing hole portions Ch to the outside space can be aggregated together at a single position. Alternatively, more than one ramified portion Br may be provided inside of the plate 36 and all of the wires W may be extended out of the plate 36 through the same opening Cp.

It should be noted that if each electrically conductive member has a branch, the branch may have such a shape as matching the shape of its associated groove portion Ct. That is to say, the branch does not have to run straight. Also, if the end of the branch sticks out of the plate 36, the portion sticking out of the plate 36 may run along the outer edge of the plate 36. For example, part of the branch of the electrically conductive member sticking out of the plate 36 may be arranged along the outer edge of the plate 36 and may be electrically connected to an associated one of the terminals in the terminal box just like the wire W shown in FIG. 12A or 12B.

<Implementation of Sealing from Fluid>

Now look at FIG. 10 again. In the example illustrated in portion (a) of FIG. 10, not only the electrically conductive member J1 but also a first O-ring 52a, washers 54, an electrically conductive ring member 56 and a second O-ring 52b are housed in the channel C61. The respective ends of the tubular thermoelectric generators T1 and T2 go through the holes of these members. The first O-ring 52a arranged closest to the shell 32 of the container 30 is in contact with the seating surface Bsa that has been formed in the first plate portion 36a and establishes sealing so as to prevent a fluid that has been supplied into the shell 32 from entering the channel C61. On the other hand, the second O-ring 52b arranged most distant from the shell 32 of the container 30 is in contact with a seating surface Bsb that has been formed in the second plate portion 36b and establishes sealing so as to prevent a fluid located outside of the second plate portion 36b from entering the channel C61.

The O-rings 52a and 52b are annular seal members with an O (i.e., circular) cross section. The O-rings 52a and 52b may be made of rubber, metal or plastic, for example, and have the function of preventing a fluid from leaking out, or flowing into, through a gap between the members. In portion (a) of FIG. 10, there is a space which communicates with the flow paths of the respective tubular thermoelectric generators T on the right-hand side of the second plate portion 36b and there is a fluid (the hot or cold medium in this example) in that space. According to this embodiment, by using the members shown in FIG. 10, electrical connection between the tubular thermoelectric generators T and sealing from the fluids (the hot and cold media) are established. The structure and function of the electrically conductive ring member 56 will be described in detail later.

The same members as the ones described for the plate 36 are provided for the plate 34, too. Although the respective openings A of the plates 34 and 36 are arranged mirror symmetrically, the groove portions connecting any two openings A together on the plate 34 are not arranged mirror symmetrically with the groove portions connecting any two openings A together on the plate 36. If the arrangement patterns of the electrically conductive members to electrically connect the tubular thermoelectric generators T together on the plates 34 and 36, were mirror symmetric to each other, then those tubular thermoelectric generators T could not be connected together in series. It should be noted that the testing hole portions Ch of the channels C of the plate 34 do not have to be arranged mirror symmetrically with the testing hole portions Ch of the channels C of the plate 36, either.

If a plate (such as the plate 36) fixed onto the shell 32 includes first and second plate portions (36a and 36b) as in this embodiment, each of the multiple openings A cut through the first plate portion (36a) has a first seating surface (Bsa) associated therewith to receive the first O-ring 52a, and each of the multiple openings A cut through the second plate portion (36b) has a second seating surface (Bsb) to receive the second O-ring 52b. However, the plates 34 and 36 do not need to have the configuration shown in FIG. 10 and the plate 36 does not have to be divided into the first and second plate portions 36a and 36b, either. If the electrically conductive member J1 is pressed by another member instead of the second plate portion 36b, the respective first O-rings 52a press against the first seating surface (Bsa) to establish sealing, too.

In the example shown in portion (a) of FIG. 10, the electrically conductive ring member 56 is interposed between the tubular thermoelectric generator T1 and the electrically conductive member J1. Likewise, another electrically conductive ring member 56 is interposed between the tubular thermoelectric generator T2 and the electrically conductive member J1, too.

The electrically conductive member J1 is typically made of a metal. Examples of materials to make the electrically conductive member J1 include copper (oxygen-free copper), brass and aluminum. The material may be plated with nickel or tin for anticorrosion purposes. As long as electrical connection is established between the electrically conductive member J (e.g., J1 in this example) and the tubular thermoelectric generators T (e.g., T1 and T2 in this example) inserted into the two through holes of the electrically conductive member J (e.g., Jh1 and Jh2 in this example), the electrically conductive member J may be partially coated with an insulator. That is to say, the electrically conductive member J may include a body made of a metallic material and an insulating coating which covers the surface of the body at least partially. The insulating coating may be made of a resin such as TEFLON™, for example. If the body of the electrically conductive member J is made of aluminum, the surface may be partially coated with an oxide skin as an insulating coating. If the electrically conductive member J has an insulating coating on its surface, the insulating coating just needs to be removed from a portion to contact with the probe, for example.

Figure 13A:
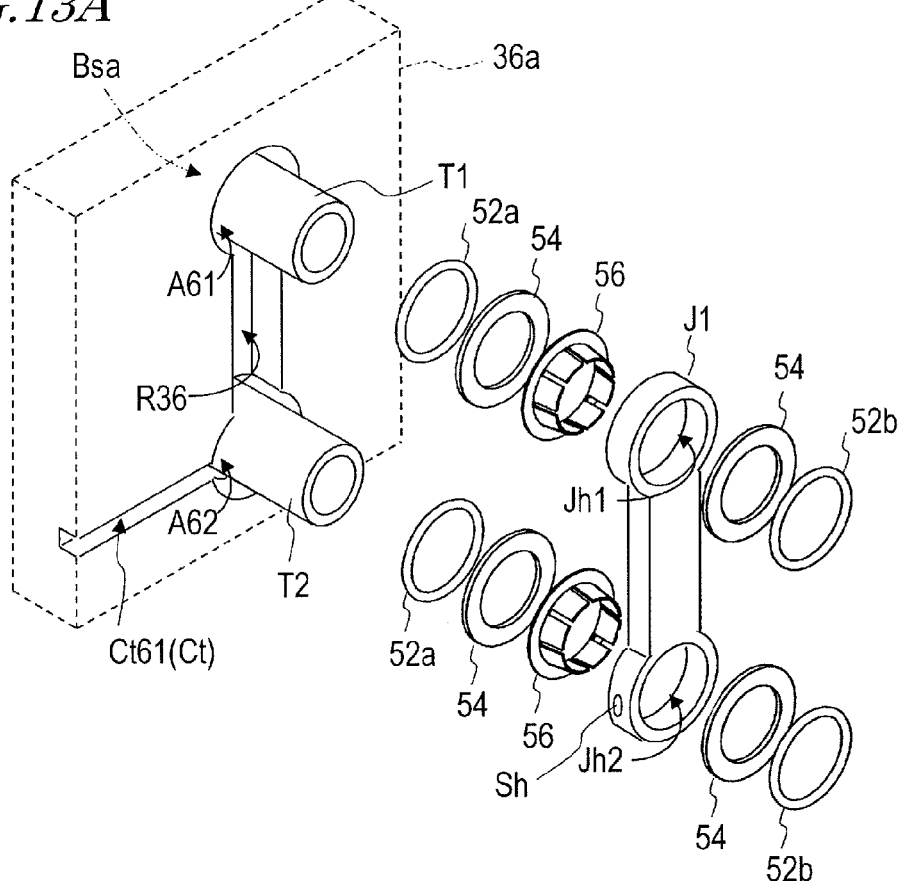
FIG. 13A is an exploded perspective view schematically illustrating the channel C61 to house the electrically conductive member J1 and its vicinity.

FIG. 13A is an exploded perspective view schematically illustrating the channel C61 to house the electrically conductive member J1 and its vicinity. As shown in FIG. 13A, the first O-rings 52a, electrically conductive ring members 56, electrically conductive member J1 and second O-rings 52b are inserted into the openings A61 and A62 from outside of the container 30. In this example, washers 54 are arranged between the first O-rings 52a and the electrically conductive ring members 56. Washers 54 may also be arranged between the electrically conductive member J1 and the second O-rings 52b. The washers 54 are inserted between the flat portions 56f of the electrically conductive ring members 56 to be described later and the O-rings 52a (or 52b).

In the example illustrated in FIG. 13A, the groove portion Ct61 runs from a portion of the recess R36 associated with the second ring portion Jr2 of the electrically conductive member J1. However, the groove portion Ct61 may run from a portion of the recess R36 associated with the first ring portion Jr1 of the electrically conductive member J1 or from a portion of the recess R36 associated with the connection portion Jc of the electrically conductive member J1. The direction in which the groove portion Ct61 runs may be determined arbitrarily.

As shown in FIG. 13A, the electrically conductive member (connection plate) J may have a threaded hole Sh which has been cut parallel to the direction in which the testing hole portion Ch runs. By cutting the threaded hole Sh in the electrically conductive member J, a wire W and the electrically conductive member J can be fixed to each other with a screw via a solderless terminal attached to the tip end of the wire W. Alternatively, a metallic bar with a thread portion at its tip end may be inserted and screwed into the threaded hole Sh of the electrically conductive member J and used as the branch of the electrically conductive member J. Optionally, the metallic bar may be fixed by solder to the electrically conductive member J.

Figure 13B:
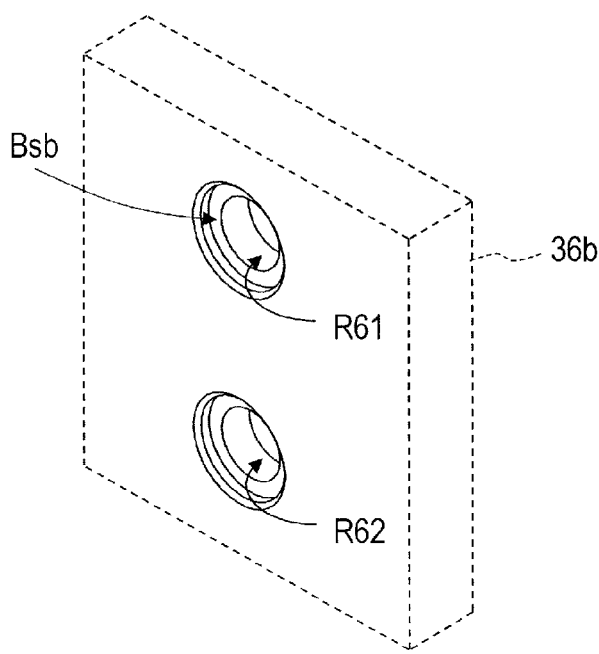
FIG. 13B is a perspective view schematically illustrating a portion of the sealing surface of the second plate portion 36b (i.e., the surface that faces the first plate portion 36a) associated with the openings A61 and A62.

FIG. 13B schematically illustrates a portion of the sealing surface of the second plate portion 36b (i.e., the surface that faces the first plate portion 36a) associated with the openings A61 and A62. As described above, the openings A61 and A62 of the second plate portion 36b each have a seating surface Bsb to receive the second O-ring 52b. That is why if the respective sealing surfaces of the first and second plate portions 36a and 36b are arranged to face each other and fastened together by flange connection, for example, the first O-rings 52a in the first plate portion 36a can be pressed against the seating surfaces Bsa. More specifically, the second seating surfaces Bsb press the first O-rings 52a against the seating surfaces Bsa through the second O-rings 52b, electrically conductive member J1 and electrically conductive ring members 56. In this manner, the electrically conductive member J1 can be sealed from the hot and cold media.

If the first and second plate portions 36a and 36b are made of an electrically conductive material such as a metal, then the sealing surfaces of the first and second plate portions 36a and 36b may be coated with an insulator material. Parts of the first and second plate portions 36a and 36b to contact with the electrically conductive member J during operation may be coated with an insulator so as to be electrically insulated from the electrically conductive member J. Likewise, parts of the first and second plate portions 36a and 36b to contact with the wire W during operation may be coated with an insulator so as to be electrically insulated from the wire W. If the first or second plate portion 36a or 36b has a groove portion Ct, the surface of the groove portion Ct may also be coated with an insulator. In this manner, an insulating coating which covers the inner peripheral surface of the testing hole portion Ch can be formed. In one implementation, the sealing surfaces of the first and second plate portions 36a and 36b may be sprayed and coated with a fluoroethylene resin.

<Detailed Configuration for Electrically Conductive Ring Members>

A detailed configuration for the electrically conductive ring members 56 will be described with reference to FIGS. 14A and 14B.

Figure 14A:
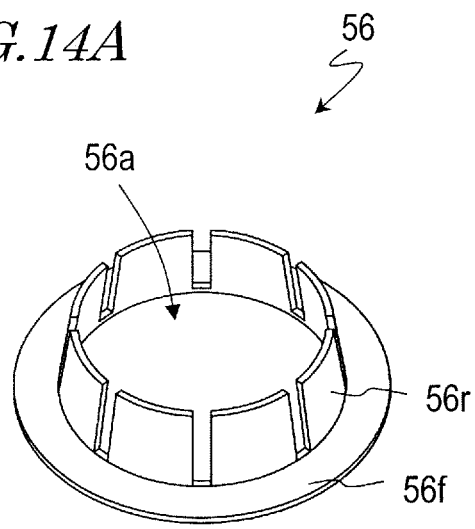
FIG. 14A is a perspective view illustrating an exemplary shape of the electrically conductive ring member 56.

FIG. 14A is a perspective view illustrating an exemplary shape of an electrically conductive ring member 56. The electrically conductive ring member 56 shown in FIG. 14A includes a ringlike flat portion 56f and a plurality of elastic portions 56r. The flat portion 56f has a through hole 56a. Those elastic portions 56r project from around the periphery of the through hole 56a of the flat portion 56f and are biased toward the center of the through hole 56a with elastic force. Such an electrically conductive ring member 56 can be made easily by patterning a single metallic plate (with a thickness of 0.1 mm to a few mm, for example). Likewise, the electrically conductive members J can also be made easily by patterning a single metallic plate (with a thickness of 0.1 mm to a few mm, for example).

An end (on the first or second electrode side) of an associated tubular thermoelectric generator T is inserted into the through hole 56a of each electrically conductive ring member 56. That is why the shape and size of the through hole 56a of the ringlike flat portion 56f are designed so as to match the shape and size of the outer peripheral surface of that end (on the first or second electrode side) of the tubular thermoelectric generator T.

Figure 15A:
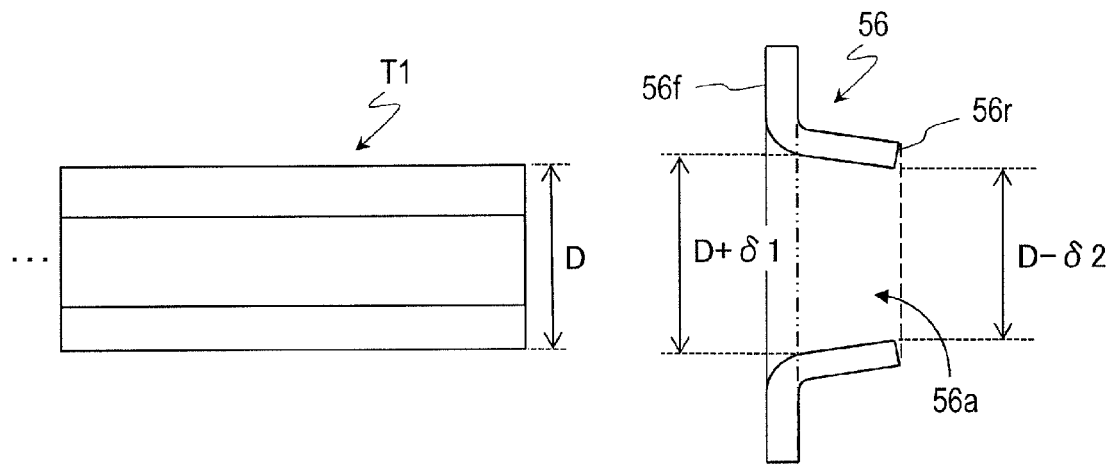
FIG. 15A is a cross-sectional view schematically illustrating the electrically conductive ring member 56 and tubular thermoelectric generator T1.
Figure 15B:
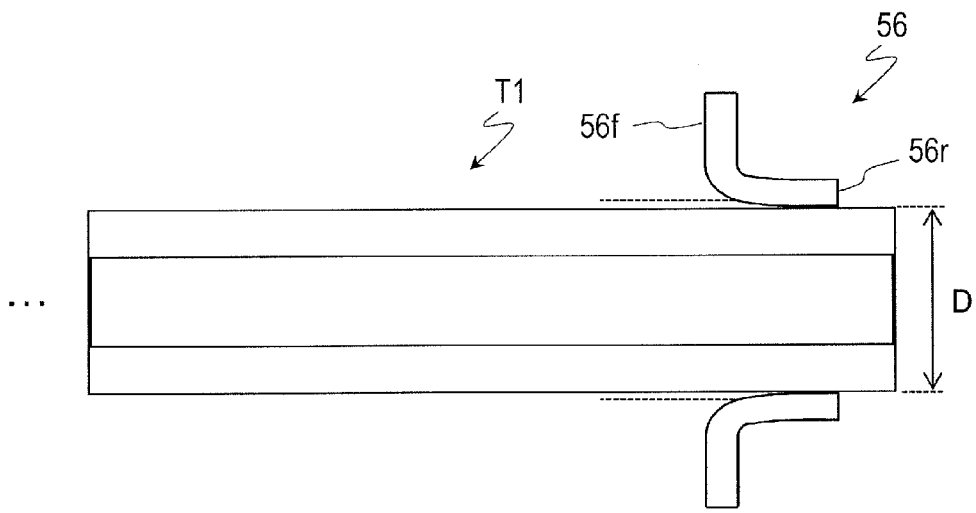
FIG. 15B is a cross-sectional view schematically illustrating a state where an end of the tubular thermoelectric generator T1 has been inserted into the electrically conductive ring member 56.
Figure 15C:
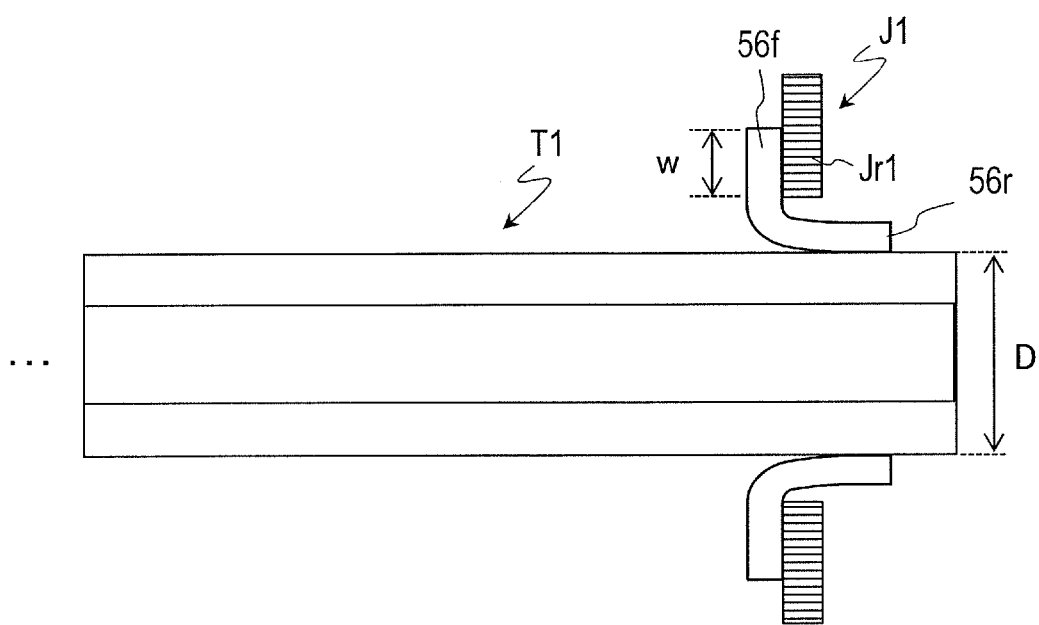
FIG. 15C is a cross-sectional view schematically illustrating a state where an end of the tubular thermoelectric generator T1 has been inserted into the electrically conductive ring member 56 and electrically conductive member J1.

Next, the shape of the electrically conductive ring member 56 will be described in further detail with reference to FIGS. 15A, 15B and 15C. FIG. 15A is a cross-sectional view schematically illustrating portions of the electrically conductive ring member 56 and tubular thermoelectric generator T1. FIG. 15B is a cross-sectional view schematically illustrating a state where an end of the tubular thermoelectric generator T1 has been inserted into the electrically conductive ring member 56. And FIG. 15C is a cross-sectional view schematically illustrating a state where an end of the tubular thermoelectric generator T1 has been inserted into the respective through holes of the electrically conductive ring member 56 and electrically conductive member J1. The cross sections illustrated in FIGS. 15A, 15B and 15C are viewed on a plane including the axis (i.e., the center axis) of the tubular thermoelectric generator T1.

Suppose the outer peripheral surface of the tubular thermoelectric generator T1 at that end (on the first or second electrode side) is a circular cylinder with a diameter D as shown in FIG. 15A. In that case, the through hole 56a of the electrically conductive ring member 56 is formed in a circular shape with a diameter D+δ1 (where δ1>1) so as to pass the end of the tubular thermoelectric generator T1. On the other hand, the respective elastic portions 56r have been formed so that biasing force is applied toward the center of the through hole 56a. The respective elastic portions 56r may be formed so as to be tilted toward the center of the through hole 56a as shown in FIG. 15A. That is to say, the elastic portions 56r have been shaped so as to be circumscribed with the outer peripheral surface of a circular cylinder, of which a cross section has a diameter that is smaller than D (and that is represented by D−δ2 (where δ2>0)) unless any external force is applied.

D+δ1>D>D−δ2 is satisfied. That is why when the end of the tubular thermoelectric generator T1 is inserted into the through hole 56a, the respective elastic portions 56r are brought into physical contact with the outer peripheral surface at the end of the tubular thermoelectric generator T1 as shown in FIG. 15B. In this case, since elastic force is applied to the respective elastic portions 56r toward the center of the through hole 56a, the respective elastic portions 56r press the outer peripheral surface at the end of the tubular thermoelectric generator T1 with the elastic force. In this manner, the outer peripheral surface of the tubular thermoelectric generator T1 inserted into the through hole 56a establishes stabilized physical and electrical contact with those elastic portions 56r.

Next, look at FIG. 15C. Inside the opening A cut through the plate 34, 36, the electrically conductive member J1 contacts with the flat portion 56f of the electrically conductive ring member 56. More specifically, when the end of the tubular thermoelectric generator T1 is inserted into the electrically conductive ring member 56 and electrically conductive member J1, the surface of the flat portion 56f of the electrically conductive ring member 56 contacts with the surface of the ring portion Jr1 of the electrically conductive member J1 as shown in FIG. 15C. As can be seen, in this embodiment, the electrically conductive ring member 56 and the electrically conductive member J1 may be electrically connected together by bringing their planes into contact with each other. Since the electrically conductive ring member 56 and the electrically conductive member J1 contact with each other on their planes, a contact area which is large enough to make the electric current generated in the tubular thermoelectric generator T1 flow can be secured. The width w of the flat portion 56f is set appropriately to secure a contact area which is large enough to make the electric current generated in the tubular thermoelectric generator T1 flow. As long as a contact area can be secured between the electrically conductive ring member 56 and the electrically conductive member J1, either the surface of the flat portion 56f or the surface of the ring portion Jr1 of the electrically conductive member J1 may have some unevenness. For example, an even larger area of contact can be secured by making the surface of the ring portion Jr1 of the electrically conductive member J1 have an embossed pattern matching the one on the surface of the flat portion 56f.

Figure 16A:
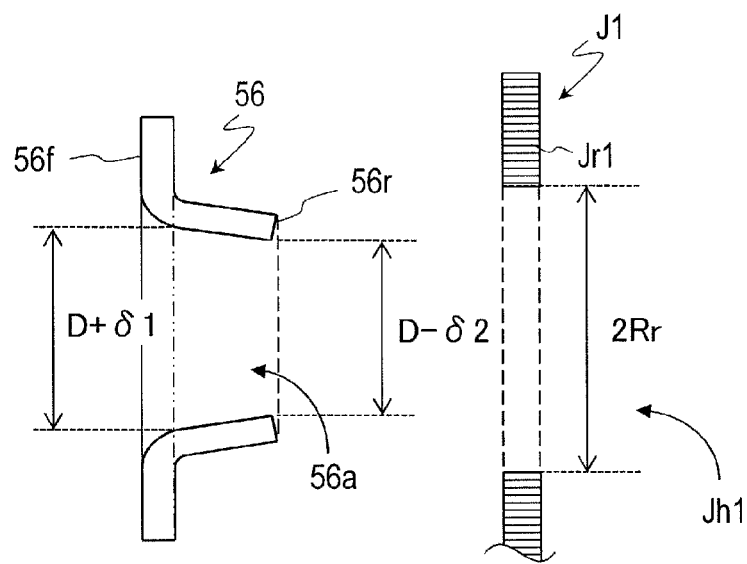
FIG. 16A is a cross-sectional view schematically illustrating the electrically conductive ring member 56 and a portion of the electrically conductive member J1.
Figure 16B:
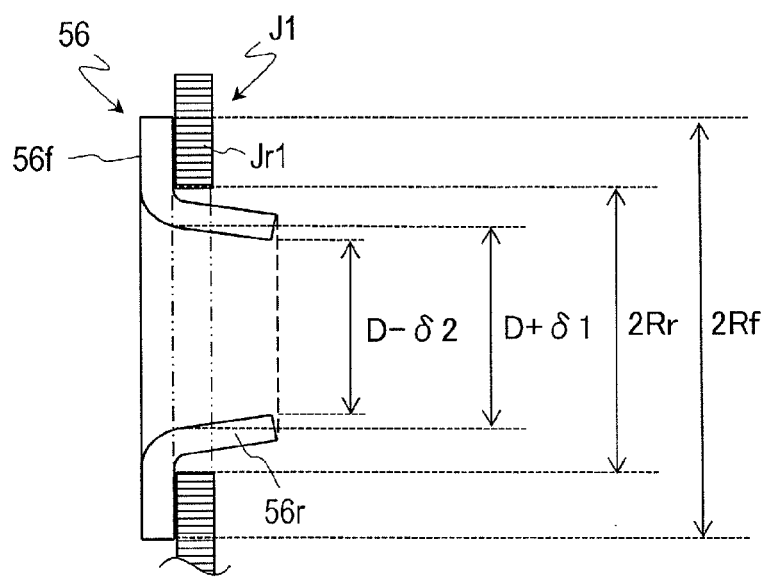
FIG. 16B is a cross-sectional view schematically illustrating a state where the elastic portions 56r of the electrically conductive ring member 56 have been inserted into the through hole Jh1 of the electrically conductive member J1.

Next, look at FIGS. 16A and 16B. FIG. 16A is a cross-sectional view schematically illustrating the electrically conductive ring member 56 and a portion of the electrically conductive member J1. FIG. 16B is a cross-sectional view schematically illustrating a state where the elastic portions 56r of the electrically conductive ring member 56 have been inserted into the through hole Jh1 of the electrically conductive member J1. The cross sections shown in FIGS. 16A and 16B are obtained by viewing the electrically conductive ring member 56 and the electrically conductive member J1 on a plane including the axis (center axis) of the tubular thermoelectric generator T1.

If the diameter of the through hole (e.g., Jh1 in this case) of the electrically conductive member J is supposed to be 2Rr, the through hole of the electrically conductive member J is formed to satisfy D<2Rr (i.e., so as to pass the end of the tubular thermoelectric generator T1 through itself). Also, if the diameter of the flat portion 56f of the electrically conductive ring member 56 is supposed to be 2Rf, the through hole of the electrically conductive member J is formed to satisfy 2Rr<2Rf so that the respective surfaces of the flat portion 56f and ring portion Jr1 contact with each other just as intended.

Figure 17:
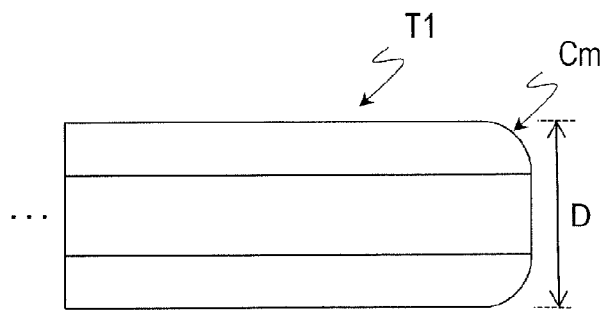
FIG. 17 is a cross-sectional view illustrating an exemplary tubular thermoelectric generator T with a chamfered portion Cm at its end.

Optionally, the end of the tubular thermoelectric generator T may have a chamfered portion Cm as shown in FIG. 17. The reason is that when the end of the tubular thermoelectric generator T (e.g., tubular thermoelectric generator T1) is inserted into the through hole 56a of the electrically conductive ring member 56, the elastic portions 56r of the electrically conductive ring member 56 and the end of the tubular thermoelectric generator T contact with each other, thus possibly getting the end of the tubular thermoelectric generator T damaged. However, by providing such a chamfered portion Cm at the end of the tubular thermoelectric generator T, such damage that could be done on the end of the tubular thermoelectric generator T due to the contact between the elastic portions 56r and the end of the tubular thermoelectric generator T can be avoided. And by avoiding the occurrence of the damage on the end of the tubular thermoelectric generator T, the electrically conductive member J1 can be sealed more securely from the hot and cold media. In addition, electrical contact failure between the outer peripheral surface of the tubular thermoelectric generator T1 and the elastic portions 56r can also be reduced. The chamfered portion Cm may have the curved surface as shown in FIG. 17 or may also have a planar surface.

And the electrically conductive member J1 contacts with the flat portion 56f of the electrically conductive ring member 56 inside of the openings A of the plate. More specifically, the surface of the first ring portion Jr1 (or the second ring portion Jr2) of the electrically conductive member J1 and the surface of the flat portion 56f of the electrically conductive ring member 56 contact with each other. In this manner, the electrically conductive member J1 is electrically connected to the outer peripheral surface at the end of the tubular thermoelectric generator T via the electrically conductive ring member 56. According to this embodiment, by fastening the first and second plate portions 36a and 36b together, the flat portion 56f of the electrically conductive ring member 56 and the electrically conductive member J can make electrical contact with each other with good stability and sealing described above can be established.

Next, it will be described how the electrically conductive ring member 56 may be fitted into the tubular thermoelectric generator T.

First of all, as shown in FIG. 13A, the respective ends of the tubular thermoelectric generators T1 and T2 are inserted into the openings A61 and A62 of the first plate portion 36a. After that, the first O-rings 52a (and the washers 54 if necessary) are fitted into the tubular thermoelectric generators through their tip ends and pushed deeper into the openings A61 and A62. Next, the electrically conductive ring members 56 are fitted into the tubular thermoelectric generators through their tip ends and pushed deeper into the openings A61 and A62. Subsequently, the electrically conductive member J1 (and the washers 54 and second O-rings 52b if necessary) is/are fitted into the tubular thermoelectric generators through their tip ends and pushed deeper into the openings A61 and A62. In this case, the electrically conductive member J1 is arranged between the first and second O-rings 52a and 52b inside the channel. Finally, the sealing surface of the second plate portion 36b is arranged to face the first plate portion 36a and the first and second plate portions 36a and 36b are fastened together by flange connection, for example, so that the respective tip ends of the tubular thermoelectric generators are inserted into the openings of the second plate portion 36b. In this case, the first and second plate portions 36a and 36b may be fastened together with bolts and nuts through the holes 36bh cut through the second plate portion 36b (shown in FIG. 7B) and the holes cut through the first plate portion 36a.

The electrically conductive ring member 56 is not connected permanently to, and is readily removable from, the tubular thermoelectric generator T. For example, when the tubular thermoelectric generator T is replaced with a new tubular thermoelectric generator T, to remove the electrically conductive ring member 56 from the tubular thermoelectric generator T, the operation of fitting the electrically conductive ring members 56 into the tubular thermoelectric generators T may be performed in reverse order. The electrically conductive ring member 56 may be used a number of times (i.e., is recyclable) or replaced with a new one.

The electrically conductive ring member 56 does not always have to have the exemplary shape shown in FIG. 14A. The ratio of the width of the flat portion 56f (as measured radially) to the radius of the through hole 56a may also be defined arbitrarily. The respective elastic portions 56r may have any of various shapes and the number of the elastic portions 56r to provide may be set arbitrarily, too.

Figure 14B:
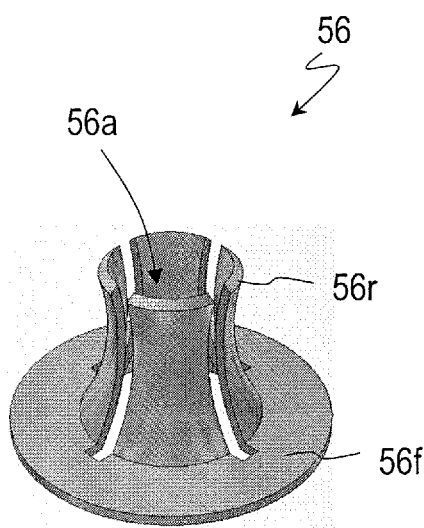
FIG. 14B is a perspective view illustrating another exemplary shape of the electrically conductive ring member 56.

FIG. 14B is a perspective view illustrating another exemplary shape of the electrically conductive ring member 56. The electrically conductive ring member 56 shown in FIG. 14B also has a ringlike flat portion 56f and a plurality of elastic portions 56r. The flat portion 56f has a through hole 56a. Each of the elastic portions 56r projects from around the through hole 56a of the flat portion 56f and is biased toward the center of the through hole 56a with elastic force. In this example, the number of the elastic portions 56r to provide is four. The number of the elastic portions 56r may be two but is suitably three or more. For example, six or more elastic portions 56r may be provided.

It should be noted that according to such an arrangement in which the flat-plate electrically conductive member J is brought into contact with the flat portion 56f of the electrically conductive ring member 56, some gap (or clearance) may be left between the through hole inside the ring portion of the electrically conductive member J and the tubular thermoelectric generator to be inserted into the hole. Thus, even if the tubular thermoelectric generator is made of a brittle material, the tubular thermoelectric generator can also be connected with good stability without allowing the ring portion Jr1 of the electrically conductive member J to do damage on the tubular thermoelectric generator.

<Electrical Connection Via Connection Plate>

As described above, the electrically conductive member (connection plate) is housed inside the channel C (i.e., inside the interconnection of the channel C) which has been cut to interconnect at least two of the openings A that have been cut through the plate 36. Note that the respective ends of the two tubular thermoelectric generators may be electrically connected together without the electrically conductive ring members 56. In other words, the electrically conductive ring members 56 may be omitted from the channel C. In that case, the respective ends of the two tubular thermoelectric generators may be electrically connected together via an electric cord, a conductor bar, or electrically conductive paste, for example. If the ends of the two tubular thermoelectric generators are electrically connected together via an electric cord, those ends of the tubular thermoelectric generators and the cord may be electrically connected together by soldering, crimping or crocodile-clipping, for example. In such a case, by inserting the probe into the testing hole portion Ch and bringing the tip end of the probe into contact with the first electrode E1 or second electrode E2 of the tubular thermoelectric generator T, electrical or thermal information about the tubular thermoelectric generator T can be retrieved out of the thermoelectric generator unit.

However, as shown in FIGS. 10 and 13A, by electrically connecting the respective ends of the two tubular thermoelectric generators via the electrically conductive member that is housed in the channel C, the those ends of the tubular thermoelectric generators T can be electrically connected together more stably. If the electrically conductive member J has a flat plate shape (e.g., if the connecting portion Jc has a broad width), the electrical resistance between the two tubular thermoelectric generators can be reduced compared to a situation where an electric cord is used. In addition, since no terminals are fixed onto the ends of the tubular thermoelectric generators T, the tubular thermoelectric generators T can be replaced easily. With the electrically conductive ring members 56, the respective ends of the two tubular thermoelectric generators can be not only fixed to each other but also electrically connected together.

In the thermoelectric generator unit 100 of the present disclosure, the plate 34 or 36 has the channel C which has been cut to connect together at least two of the openings A, and therefore, electrical connecting function which has never been provided by any tube sheet for a heat exchanger is realized. In addition, since the thermoelectric generator unit 100 can be configured so that the first and second O-rings 52a and 52b press the seating surfaces Bsa and Bsb, respectively, sealing can be established so that either airtight or watertight condition is maintained with the ends of the tubular thermoelectric generators T inserted. By providing the channel C for the plate 34 or 36, even in an implementation in which the electrically conductive ring members 56 are omitted, the ends of the two tubular thermoelectric generators can also be electrically connected together and sealing from the fluids (e.g., the hot and cold media) can also be established.

<Relation Between Direction of Flow of Heat and Tilt Direction of Planes of Stacking>

Now, the relation between the direction of flow of heat in each thermoelectric generation tube T and the tilt direction of the planes of stacking in the thermoelectric generation tube T will be described with reference to FIGS. 18A and 18B.

Figure 18A:
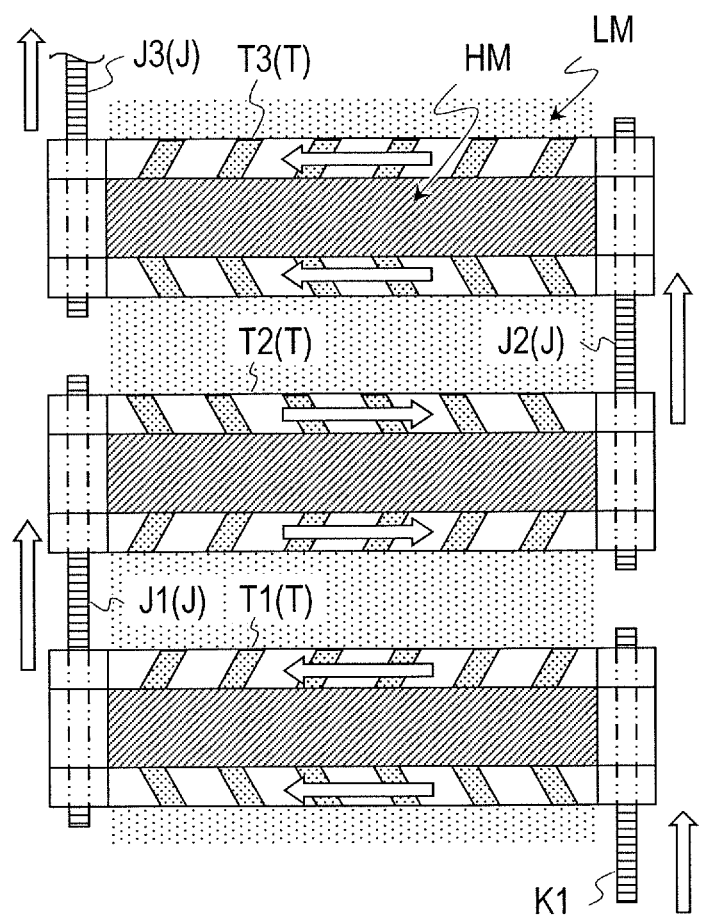
FIG. 18A schematically illustrates how electric current flows in tubular thermoelectric generators T which are electrically connected together in series.

FIG. 18A schematically illustrates how electric current flows in tubular thermoelectric generators T which are electrically connected together in series. FIG. 18A schematically illustrates cross sections of three (T1 to T3) of the tubular thermoelectric generators T1 to T10.

In FIG. 18A, an electrically conductive member (terminal plate) K1 is connected to one end of the tubular thermoelectric generator T1 (e.g., at the first electrode end), while an electrically conductive member (connection plate) J1 is connected to the other end (e.g., at the second electrode end) of the tubular thermoelectric generator T1. The electrically conductive member J1 is also connected to one end (i.e., at the first electrode end) of the tubular thermoelectric generator T2. As a result, the tubular thermoelectric generators T1 and T2 are electrically connected together. Furthermore, the other end (i.e., at the second electrode end) of the tubular thermoelectric generator T2 and one end (i.e., at the first electrode end) of the tubular thermoelectric generator T3 are electrically connected together via the electrically conductive member J2.

In this case, as shown in FIG. 18A, the tilt direction of the planes of stacking in the tubular thermoelectric generator T2 is opposite from the tilt direction of the planes of stacking in the tubular thermoelectric generator T1. Likewise, the tilt direction of the planes of stacking in the tubular thermoelectric generator T3 is opposite from the tilt direction of the planes of stacking in the tubular thermoelectric generator T2. That is to say, in this thermoelectric generator unit 100, each of the tubular thermoelectric generator T1 to T10 has planes of stacking that is tilted in the opposite direction from those of an adjacent one of the tubular thermoelectric generators that is connected to itself via a connection plate.

Suppose the hot medium HM has been brought into contact with the inner peripheral surface of each of the tubular thermoelectric generators T1 to T3, and the cold medium LM has been brought into contact with their outer peripheral surface, as shown in FIG. 18A. In that case, in the tubular thermoelectric generator T1, electric current flows from the right to the left on the paper, for example. On the other hand, in the tubular thermoelectric generator T2, of which the planes of stacking are tilted in the opposite direction from those of the tubular thermoelectric generator T1, electric current flows from the left to the right on the paper.

Figure 19:
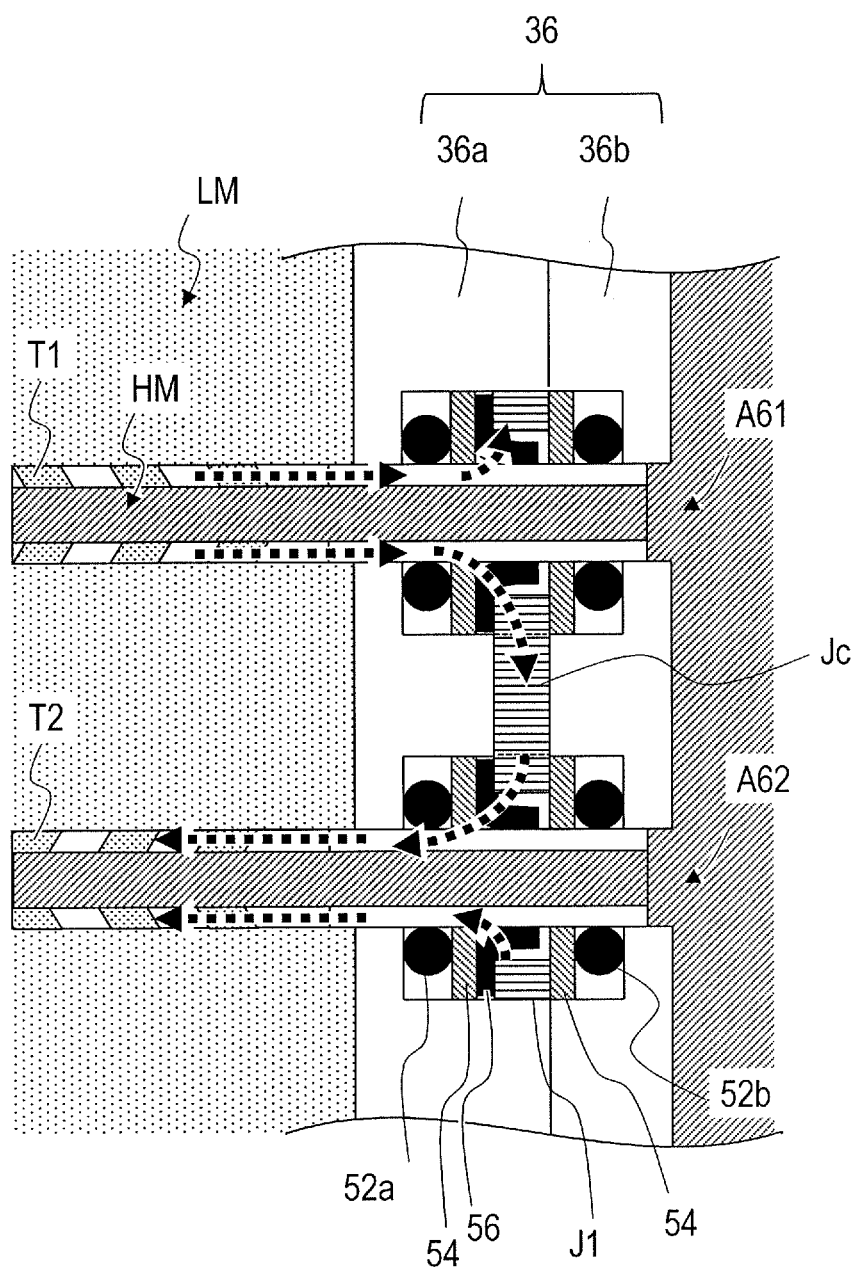
FIG. 19 schematically shows the directions in which electric current flows through the two openings A61 and A62 and their surrounding region.

FIG. 19 schematically shows the directions in which electric current flows through the two openings A61 and A62 and their surrounding region. FIG. 19 is a drawing corresponding to portion (a) of FIG. 10. In FIG. 19, the flow directions of the electric current are schematically indicated by the dotted arrows. As shown in FIG. 19, the electric current generated in the tubular thermoelectric generator T1 flows toward the tubular thermoelectric generator T2 through the electrically conductive ring member 56 of the opening A61, the electrically conductive member J1 and the electrically conductive ring member 56 of the opening A62 in this order. The electric current that has flowed into the tubular thermoelectric generator T2 is combined with electric current generated in the tubular thermoelectric generator T2, and the electric current thus combined flows toward the tubular thermoelectric generator T3. As shown in FIG. 18A, the planes of stacking of the tubular thermoelectric generator T3 are tilted in the opposite direction from those of the tubular thermoelectric generator T2. That is why in the tubular thermoelectric generator T3, the electric current flows from the right to the left in FIG. 18A. Consequently, the electromotive forces generated in the respective tubular thermoelectric generators T1 to T3 get superposed one upon the other without canceling each other. By sequentially connecting a plurality of tubular thermoelectric generators T together in this manner so that the tilt direction of their planes of stacking inverts alternately one generator after another, an even greater voltage can be extracted from the thermoelectric generator unit.

Figure 18B:
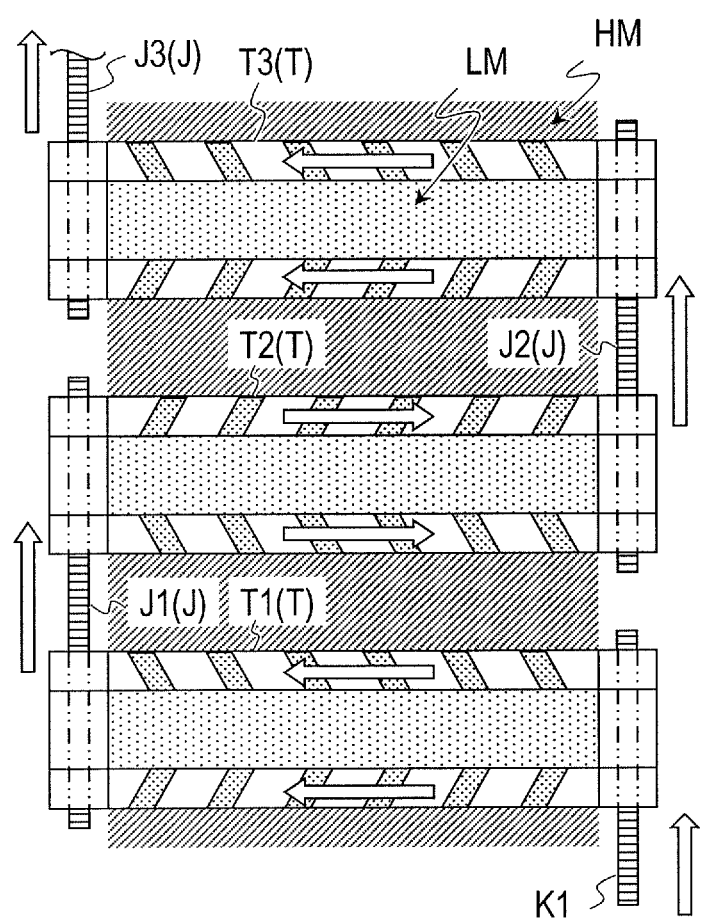
FIG. 18B schematically illustrates how electric current flows in tubular thermoelectric generators T which are electrically connected together in series.

Next, look at FIG. 18B, which also schematically shows, just like FIG. 18A, electric current flowing through tubular thermoelectric generators T which are electrically connected in series. As in the example shown in FIG. 18A, the tubular thermoelectric generators T1 to T3 are also sequentially connected in FIG. 18B so that the tilt direction of their planes of stacking inverts alternately one generator after another. In this case, since the planes of stacking in one of any two adjacent tubular thermoelectric generators connected together are tilted in the opposite direction from the planes of stacking in the other tubular thermoelectric generator, the electromotive forces generated in the respective tubular thermoelectric generators T1 to T3 get superposed one upon the other without canceling each other.

If the cold medium LM is brought into contact with the inner peripheral surface of each of the tubular thermoelectric generators T1 to T3 and the hot medium HM is brought into contact with their outer peripheral surface as shown in FIG. 18B, the polarity of voltage generated in each of the tubular thermoelectric generators T1 to T3 becomes opposite from the one shown in FIG. 18A. In other words, if the direction of the temperature gradient in each tubular thermoelectric generator is inverted, then the polarity of the electromotive force in that tubular thermoelectric generator (which may also be called the direction of electric current flowing through that tubular thermoelectric generator) inverts. Therefore, to make electric current flow from the electrically conductive member K1 toward the electrically conductive member J3 as in FIG. 18A, the configurations on the first and second electrode sides in each of the tubular thermoelectric generators T1 to T3 may be opposite from the configurations shown in FIG. 18A. It should be noted that electric current flow directions shown in FIGS. 18A and 18B are just examples. Depending on the material to make the metal layers 20 and the thermoelectric material to make the thermoelectric material layers 22, the electric current flow directions may be opposite from the ones shown in FIGS. 18A and 18B.

As already described with reference to FIGS. 18A and 18B, the polarity of the voltage generated in the tubular thermoelectric generator T depends on the tilt direction of the planes of stacking of that tubular thermoelectric generator T. That is why when the tubular thermoelectric generator T is going to be replaced, for example, the tubular thermoelectric generator T needs to be arranged appropriately with the temperature gradient between the inner and outer peripheral surfaces of the tubular thermoelectric generator T in the thermoelectric generator unit 100 taken into account.

Figure 20A:
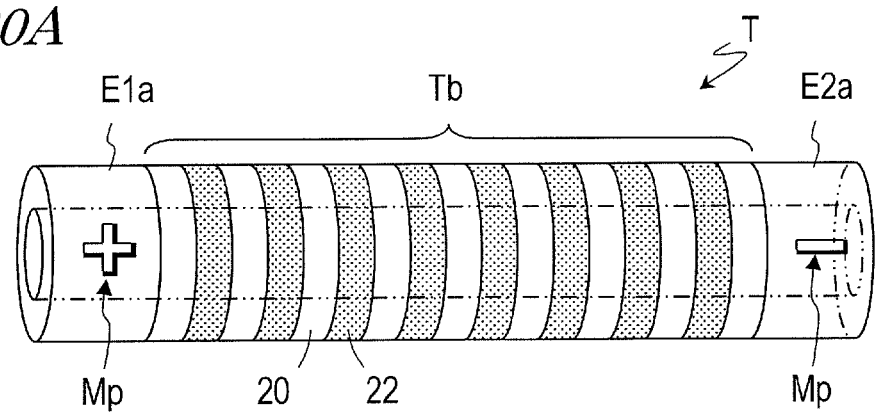
FIG. 20A is a perspective view illustrating an exemplary tubular thermoelectric generator, of which the electrodes have indicators of their polarity.
Figure 20B:
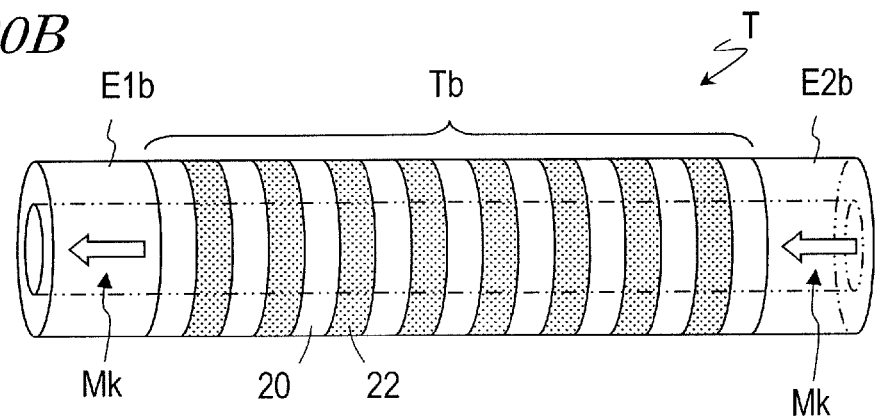
FIG. 20B is a perspective view illustrating another exemplary tubular thermoelectric generator, of which the electrodes have indicators of their polarity.

FIGS. 20A and 20B are perspective views each illustrating an exemplary tubular thermoelectric generator, of which the electrodes have indicators of their polarity. In the tubular thermoelectric generator T shown in FIG. 20A, molded portions (embossed marks) Mp indicating the polarity of the voltage generated in the tubular thermoelectric generator have been formed on the first and second electrodes E1a and E2a. On the other hand, in the tubular thermoelectric generator T shown in FIG. 20B, marks Mk indicating whether the planes of stacking in the tubular thermoelectric generator T are tilted toward the first electrode E1b or the second electrode E2b are left on the first and second electrodes E1b and E2b. These molded portions (e.g., convex or concave portions) and marks may be combined together. Optionally, these molded portions and marks may be added to the tube body Tb or to only one of the first and second electrodes.

In this manner, molded portions or marks indicating the polarity of the voltage generated in the tubular thermoelectric generator T may be added to the first and second electrodes, for example. In that case, it can be seen quickly just from the appearance of the tubular thermoelectric generator T whether the planes of stacking of the tubular thermoelectric generator T are tilted toward the first electrode or the second electrode. Optionally, instead of adding such molded portions or marks, the first and second electrodes may have mutually different shapes. For example, the lengths, thicknesses or cross-sectional shapes as viewed on a plane that intersects with the axial direction at right angles may be different from each other between the first and second electrodes.

<Electrical Connection Structure for Taking Electric Power Out of Thermoelectric Generator Unit 100>

Now look at FIG. 5 again. In the example illustrated in FIG. 5, ten tubular thermoelectric generators T1 to T10 are electrically connected in series via electrically conductive members J1 to J9. Each of these electrically conductive members J1 to J9 connects its associated two tubular thermoelectric generators T together just as described above. An exemplary electrical connection structure for taking electric power out of the thermoelectric generator unit 100 from the two tubular generators T1 and T10 located at both ends of the series circuit will now be described.

Figure 21:
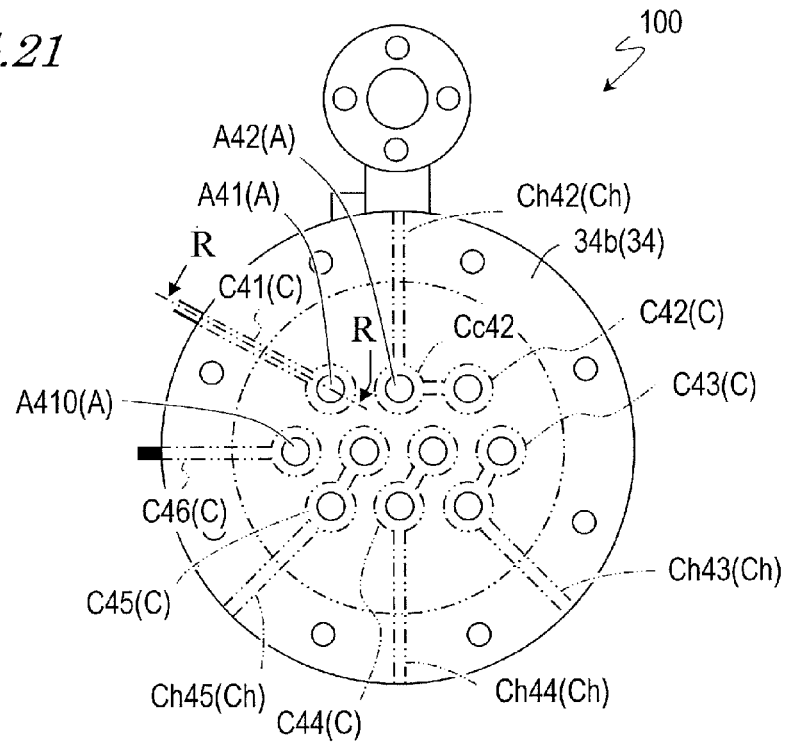
FIG. 21 illustrates the other side face of the thermoelectric generator unit 100 shown in FIG. 7A (left side view).

First, look at FIG. 21, which illustrates the other side face of the thermoelectric generator unit 100 shown in FIG. 7A (left side view). While FIG. 7B shows a configuration for the plate 36, FIG. 21 shows a configuration for the plate 34. Any member or operation that has already been described with respect to the plate 36 will not be described all over again to avoid redundancies.

As shown in FIG. 21, each of the channels C42 to C45 interconnects at least two of the openings A cut through the plate 34. The electrically conductive members housed in the interconnections may have the same configuration as the electrically conductive member J1. On the other hand, the channel C41 is provided for the plate 34 so as to run from the opening A41 to the outer edge of the plate 34. In the present specification, such a channel provided to run from an opening of a plate to its outer edge will sometimes be referred to as a "terminal connection" hereinbelow. The channels C41 and C46 shown in FIG. 21 are terminal connections. In each terminal connection, the electrically conductive member functioning as a terminal for connecting to an external circuit is housed.

The channels C42 to C45 shown in FIG. 21 respectively have testing hole portions Ch42 to Ch45 which run from the interconnections through the outer edge of the plate 34. For example, the testing hole portion Ch42 of the channel C42 is arranged so as to run straight from the interconnection Cc42 through the outer edge of the plate 34. Thus, a test probe for the tubular thermoelectric generator T can be inserted into the opening Cp cut through the outer edge of the plate 34.

Figure 22:
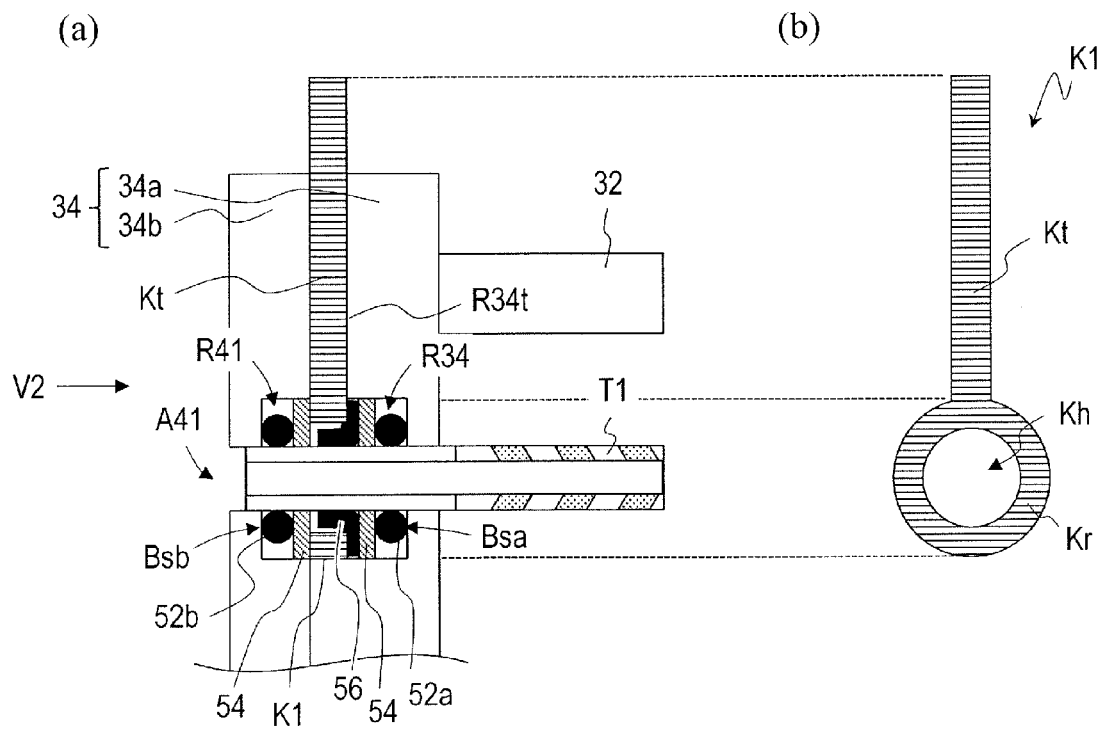
FIG. 22 schematically illustrates a cross section of a portion of a plate 34 and the appearance of an electrically conductive member K1.

Portion (a) of FIG. 22 is a schematic partial cross-sectional view of the plate 34. Specifically, portion (a) of FIG. 22 schematically illustrates a cross section of the plate as viewed on a plane including the center axis of the tubular thermoelectric generator T1 and corresponding to the plane R-R' shown in FIG. 21. More specifically, portion (a) of FIG. 22 illustrates the structure of one A41 of multiple openings A that the plate 34 has and a region surrounding it. Portion (b) of FIG. 22 illustrates the appearance of an electrically conductive member K1 as viewed in the direction indicated by the arrow V2 in portion (a) of FIG. 22. This electrically conductive member K1 has a through hole Kh at one end. More specifically, this electrically conductive member K1 includes a ring portion Kr with the through hole Kh and a terminal portion Kt extending outward from the ring portion Kr. Just like the electrically conductive member J1, this electrically conductive member K1 is also typically made of a metal. In the present specification, an electrically conductive member, one end of which receives a tubular thermoelectric generator inserted and the other end of which sticks out, will sometimes be referred to as a "terminal plate" hereinbelow.

As shown in portion (a) of FIG. 22, one end of the tubular thermoelectric generator T1 (on the first electrode side) is inserted into the opening A41 of the plate 34. In this state, the end of the tubular thermoelectric generator T1 is inserted into the through hole Kh of the electrically conductive member K1. As can be seen, an electrically conductive member J or K1 according to this embodiment can be said to be an electrically conductive plate with at least one hole to pass the tubular thermoelectric generator T through. The structure of the opening A410 and the region surrounding it is the same as that of the opening A41 and the region surrounding it except that the end of the tubular thermoelectric generator T10 is inserted into the opening A410 of the plate 34.

In the example illustrated in portion (a) of FIG. 22, the first plate portion 34a has a recess R34 which has been cut for the opening A41. This recess R34 includes a groove portion R34t which extends from the opening A41 through the outer edge of the first plate portion 34a. In this groove portion R34t, located is the terminal portion Kt of the electrically conductive member K1. In this example, the space defined by the recess R34 and a recess R41 which has been cut in the second plate portion 34b forms a channel to house the electrically conductive member K1. As in the example illustrated in portion (a) of FIG. 10, not only the electrically conductive member K1 but also a first O-ring 52a, washers 54, an electrically conductive ring member 56 and a second O-ring 52b are housed in the channel C41 in the example illustrated in portion (a) of FIG. 22, too. And the end of the tubular thermoelectric generator T1 goes through the holes of these members. The first O-ring 52a establishes sealing so as to prevent a fluid that has been supplied into the shell 32 from entering the channel C41. On the other hand, the second O-ring 52b establishes sealing so as to prevent a fluid located outside of the second plate portion 34b from entering the channel C41.

Figure 23:
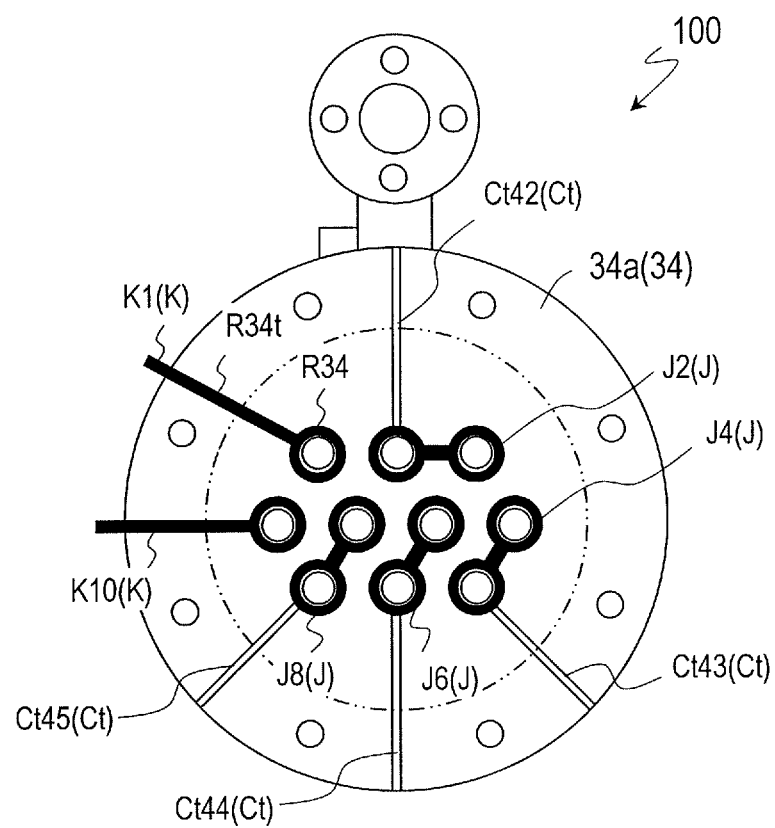
FIG. 23 illustrates the first plate portion 34a as viewed in the direction indicated by the arrow V2 in portion (a) of FIG. 22.

FIG. 23 illustrates the first plate portion 34a as viewed in the direction indicated by the arrow V2 in portion (a) of FIG. 22. As shown in FIG. 23, the electrically conductive members J or K can be arranged in the recesses that have been cut on the first plate portion 34a. That is why by fastening the first and second plate portions 34a and 34b together, the electrically conductive members (connection plates) J2, J4, J6, and J8 are housed in the interconnections of the channels C, and the electrically conductive members (terminal plates) K1 and K10 are housed in the terminal connections of the channels C.

As shown in FIG. 23, the sealing surface of the first plate portion 34a (i.e., its surface that faces the second plate portion 34b) may have groove portions Ct that connect with the recesses. In the exemplary configuration shown in FIG. 23, the groove portions Ct42 to Ct45 run from the recesses in which the electrically conductive members J2, J4, J6, and J8 are arranged through the outer edge of the first plate portion 34a. It should be noted that the space (i.e., hole portion) defined by the groove portion R34t in which the terminal portion Kt of the electrically conductive member K1 is arranged and the sealing surface of the second plate portion 34b (i.e., its surface that faces the first plate portion 34a) does not run from any interconnection, which is different from the testing hole portion Ch.

Optionally, a terminal box Tbx such as the ones shown in FIGS. 12A and 12B may be arranged at the outer edge of the plate 34. The terminal box Tbx may be arranged either at the respective outer edges of both of the plates 34 and 36 or only at the outer edge of one of the plates 34 and 36. For example, the wires W extended out of the plate 34 may be connected to the terminals in the terminal box Tbx arranged at the outer edge of the plate 36. If the wires W extended out of the plate 34 and the wires W extended out of the plate 36 are aggregated together at the same location, there is no need to insert probes into the respective testing hole portions Ch of the plates 34 and 36 at the same time. Consequently, decision can be made more easily what tubular thermoelectric generator T has caused a failure.

Figure 24:
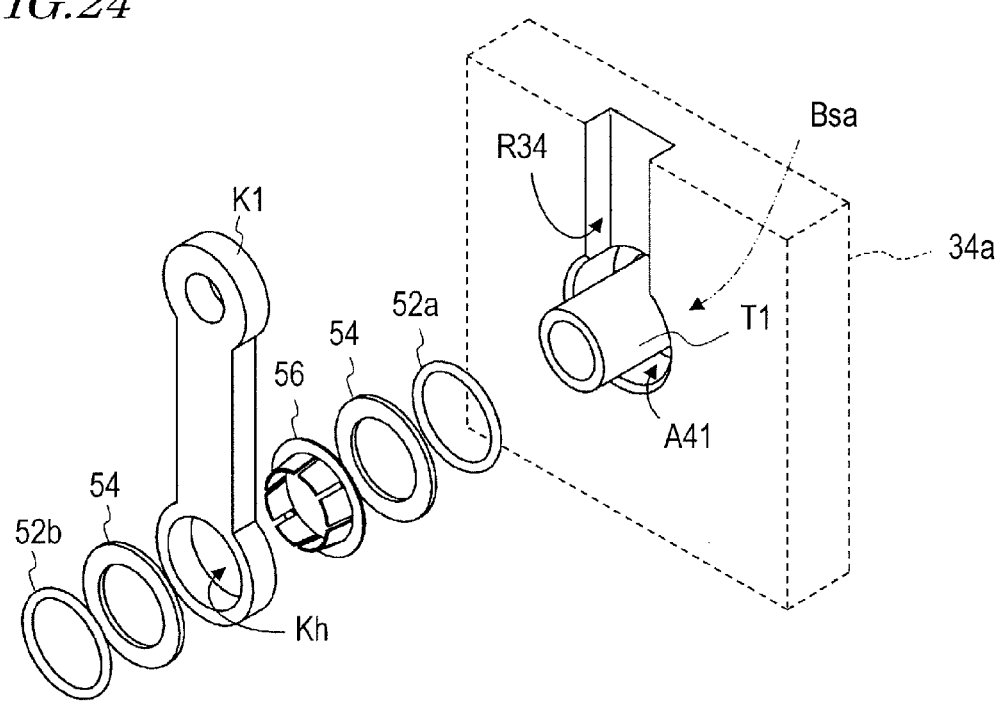
FIG. 24 is an exploded perspective view schematically illustrating the channel C41 to house the electrically conductive member K1 and its vicinity.

FIG. 24 is an exploded perspective view schematically illustrating the channel C41 to house the electrically conductive member K1 and its vicinity. For example, a first O-ring 52a, a washer 54, an electrically conductive ring member 56, the electrically conductive member K1, another washer 54 and a second O-ring 52b may be inserted into the opening A41 from outside of the container 30. The sealing surface of the second plate portion 34b (i.e., the surface that faces the first plate portion 34a) has substantially the same configuration as the sealing surface of the second plate portion 36b shown in FIG. 13B. Thus, by fastening the first and second plate portions 34a and 34b together, the second seating surface Bsb of the second plate portion 34b presses the first O-ring 52a against the seating surface Bsa of the first plate portion 34a through the second O-ring 52b, electrically conductive member K1 and electrically conductive ring member 56. In this manner, the electrically conductive member K1 can be sealed from the hot and cold media.

The ring portion Kr of the electrically conductive member K1 contacts with the flat portion 56f of the electrically conductive ring member 56 inside the opening A cut through the plate 34. In this manner, the electrically conductive member K1 is electrically connected to the outer peripheral surface at the end of the tubular thermoelectric generator T via the electrically conductive ring member 56. In this case, one end of the electrically conductive member K1 (i.e., the terminal portion Kt) sticks out of the plate 34 as shown in portion (a) of FIG. 22. Thus, that part of the terminal portion Kt that sticks out of the plate 34 may function as a terminal to connect the thermoelectric generator unit to an external circuit. In addition, through that part of the terminal portion Kt that sticks out of the plate 34, electrical or thermal information about the electrically conductive member K (e.g., K1 in this example) can be retrieved out of the thermoelectric generator unit 100. As shown in FIG. 24, that part of the terminal portion Kt to stick out of the plate 34 may have a ring shape.

As described above, in a thermoelectric generator unit according to the present disclosure (e.g., the thermoelectric generator unit 100 in this example), the tubular thermoelectric generators T1 and T10 are respectively connected to the two terminal plates housed in the terminal connections. In addition, between those two terminal plates, those tubular thermoelectric generators T1 through T10 are electrically connected together in series via the connection plate housed in the interconnection of the channel. Consequently, through the two terminal plates, one end of which sticks out of the plate (34, 36), the electric power generated by those tubular thermoelectric generators T1 to T10 can be taken out of this thermoelectric generator unit 100.

The arrangements of the electrically conductive ring member 56 and electrically conductive member J, K1 may be changed appropriately inside the channel C. In that case, the electrically conductive ring member 56 and the electrically conductive member (J, K1) just need to be arranged so that the elastic portions 56r of the electrically conductive ring member 56 are inserted into the through hole Jh1, Jh2 or Kh of the electrically conductive member. Also, as mentioned above, in an implementation in which the electrically conductive ring member 56 is omitted, the end of the tubular thermoelectric generator T may be electrically connected to the electrically conductive member K1. Optionally, part of the flat portion 56f of the electrically conductive ring member 56 may be extended and used in place of the terminal portion Kt of the electrically conductive member K1. In that case, the electrically conductive member K1 may be omitted.

According to the embodiment described above, electrical or thermal information about the electrically conductive members J housed in the interconnections can be gotten through the testing hole portions Ch cut through the plate. In this case, a metallic probe may be inserted into any of the testing hole portions Ch and the tip end of the probe may be brought into contact with one of the electrically conductive members J. Alternatively, a portion of the electrically conductive member J may stick out of the plate as shown in FIG. 11B and that portion sticking out of the plate may be probed.

For example, by measuring the potentials at the electrically conductive members J1 and J2, the potential difference between the first and second electrodes E1 and E2 of the tubular thermoelectric generator T2 can be obtained (see FIGS. 18A and 18B). Likewise, by measuring the potentials at the electrically conductive members K1 and J1, the potential difference between the first and second electrodes E1 and E2 of the tubular thermoelectric generator T1 can be obtained. In this manner, the potential difference between the first and second electrodes E1 and E2 of each tubular thermoelectric generator T can be obtained. That is why even if some failure has occurred accidentally in any of the tubular thermoelectric generators T while the thermoelectric generator unit 100 is operating, it is easy to determine what tubular thermoelectric generator T has caused the failure.

In the embodiments described above, a channel C is formed by respective recesses cut in the first and second plate portions. However, the channel C may also be formed by a recess which has been cut in one of the first and second plate portions. If the container 30 is made of a metallic material, the inside of the channel C may be coated with an insulator to prevent the electrically conductive members (i.e., the connection plates and the terminal plates) from becoming electrically conductive with the container 30. For example, the plate 34 (consisting of the plate portions 34a and 34b) may be comprised of a body made of a metallic material and an insulating coating which covers the surface of the body at least partially. Likewise, the plate 36 (consisting of the plate portions 36a and 36b) may also be comprised of a body made of a metallic material and an insulating coating which covers the surface of the body at least partially. If the respective surfaces of the recesses cut in the first and second plate portions are coated with an insulator, the insulating coating can be omitted from the surface of the electrically conductive member.

<Another Exemplary Structure to Establish Sealing and Electrical Connection>

Figure 25A:
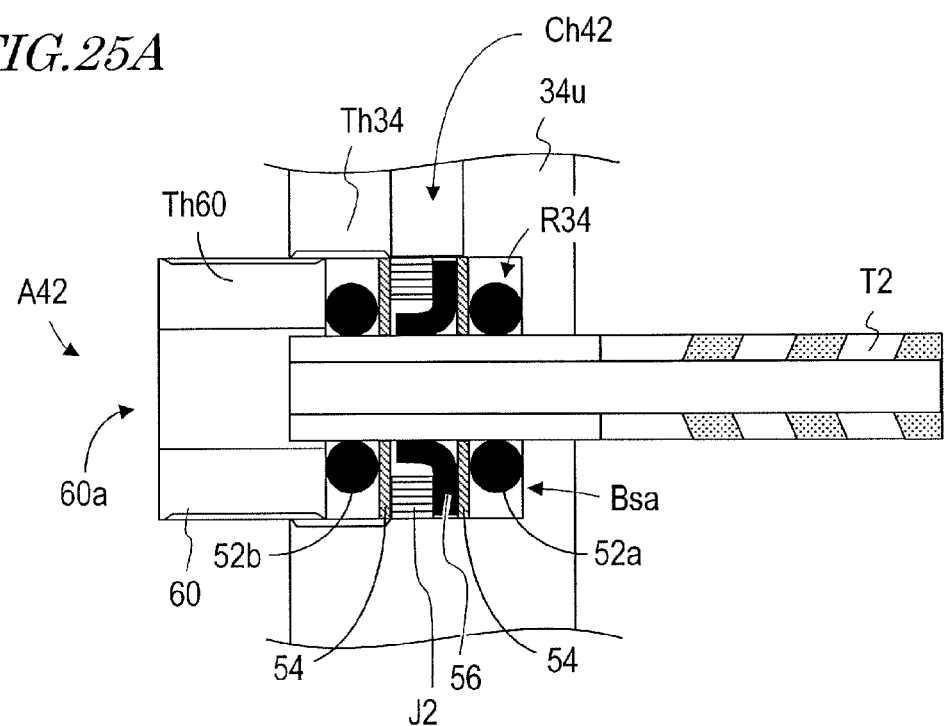
FIG. 25A is a cross-sectional view illustrating another exemplary structure for separating the hot and cold heat transfer media from each other and electrically connecting the tubular thermoelectric generator and the electrically conductive member together.
Figure 25B:
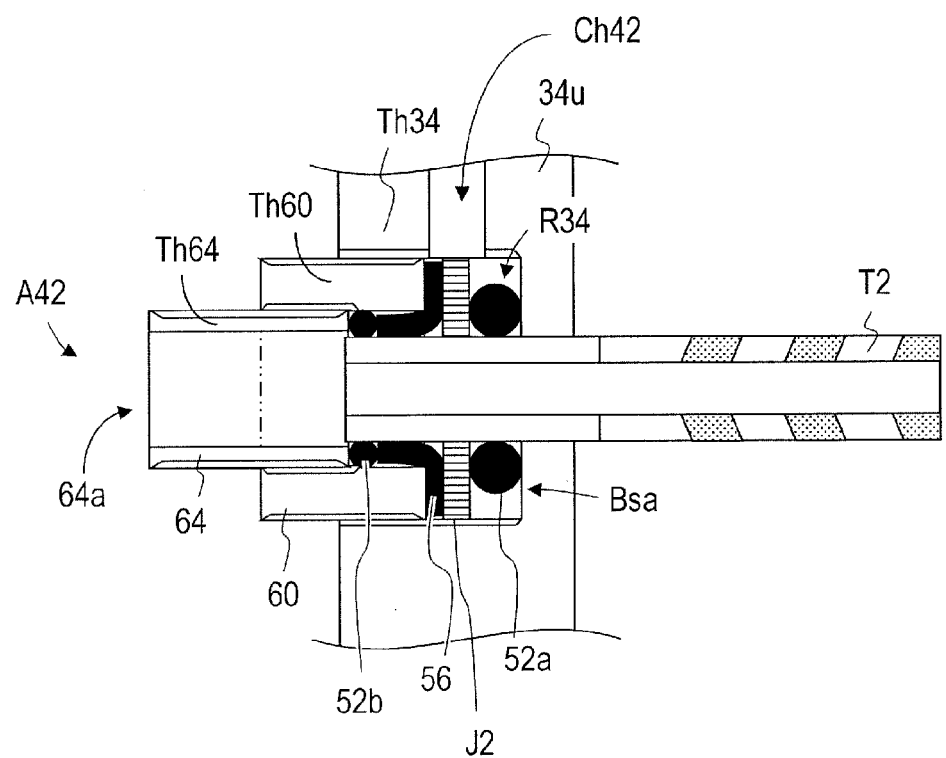
FIG. 25B is a cross-sectional view illustrating still another exemplary structure for separating the hot and cold heat transfer media from each other and electrically connecting the tubular thermoelectric generator and the electrically conductive member together.

FIGS. 25A and 25B are cross-sectional views illustrating another exemplary structure for separating the hot and cold media from each other and establishing electrical connection between the tubular thermoelectric generators and the electrically conductive members.

In the example illustrated in FIG. 25A, a bushing 60 is inserted from outside of the container 30, thereby separating the hot and cold media from each other and electrically connecting the tubular thermoelectric generator and the electrically conductive member together. In the example illustrated in FIG. 25A, the opening A42 (see FIG. 21) cut through the plate 34u has an internal thread portion Th34. More specifically, the wall surface of the recess R34 that has been cut with respect to the opening A42 of the plate 34u has the thread. The busing 60 with an external thread portion Th60 is inserted into the recess R34. The bushing 60 has a through hole 60a that runs in the axial direction. In this case, the end of the tubular thermoelectric generator T2 has been inserted into the opening A42 of the plate 34u. That is why when the busing 60 is inserted into the recess R34, the through hole 60a communicates with the internal flow path of the tubular thermoelectric generator T2.

Inside the space left between the recess R34 and the busing 60, arranged are various members to establish sealing and electrical connection. In the example shown in FIG. 25A, a first O-ring 52a, a washer 54, the electrically conductive ring member 56, the electrically conductive member J2, another washer 54 and a second O-ring 52b are arranged in this order from the seating surface Bsa of the plate 34u toward the outside of the container 30. The end of the tubular thermoelectric generator T2 is inserted into the respective holes of these members. The first O-ring 52a contacts with the seating surface Bsa of the plate 34u and the outer peripheral surface at the end of the tubular thermoelectric generator T2. In this case, when the external thread portion Th60 is inserted into the internal thread portion Th34, the external thread portion Th60 presses the first O-ring 52a against the seating surface Bsa via the flat portion 56f of the electrically conductive ring member 56 and the electrically conductive member J2. As a result, sealing can be established so as to prevent the fluid supplied into the shell 32 and the fluid supplied into the internal flow path of the tubular thermoelectric generator T2 from mixing with each other. In addition, the second O-ring 52b contacts with the external thread portion Th60 of the bushing 60 and the outer peripheral surface at the end of the tubular thermoelectric generator T2. In this case, the external thread portion Th60 of the bushing 60 presses the second O-ring 52b against the seating surface Bsa. As a result, sealing can be established so as to prevent the fluid outside of the plate 34u from entering the inside of the channel C. Furthermore, since the outer peripheral surface of the tubular thermoelectric generator T2 contacts with the elastic portions 56r of the electrically conductive ring member 56 and since the flat portion 56f of the electrically conductive ring member 56 contacts with the ring portion of the electrically conductive member J2, the tubular thermoelectric generator and the electrically conductive member can be electrically connected together.

On the other hand, in the example shown in FIG. 25B, a first O-ring 52a, the electrically conductive member J2, the electrically conductive ring member 56 and a second O-ring 52b are arranged in this order from the seating surface Bsa of the plate 34u toward the outside of the container 30. In addition, in FIG. 25B, another busing 64 with a through hole 64a has been inserted into the through hole 60a of the busing 60. The through hole 64a also communicates with the internal flow path of the tubular thermoelectric generator T2. In the example illustrated in FIG. 25B, the external thread portion Th64 of the busing 64 presses the second O-ring 52b against the seating surface Bsa.

Sealing from both of the fluids (the hot and cold media) can be established by arranging the first and second O-rings 52a and 52b in this manner. By establishing sealing from both of the fluids (the hot and cold media), corrosion of the electrically conductive ring member 56 can be minimized. Also, by using the busing, for example, as shown in FIGS. 25A and 25B, the hot and cold media can be separated from each other and the tubular thermoelectric generator and the electrically conductive member can be electrically connected together with an even simpler configuration. A washer 54 may be arranged between the O-ring and the electrically conductive member, for example.

<Thermoelectric Generator System Including the Thermoelectric Generator Unit>

Next, a thermoelectric generator system including the thermoelectric generator unit according to the present disclosure will be described.

The thermoelectric generator unit according to the present disclosure may be used by itself or a plurality of thermoelectric generator units may be used in combination. For example, if a thermoelectric generator system includes two thermoelectric generator units 100, that thermoelectric generator system has a first a plurality of openings communicating with the respective flow paths of the multiple tubular thermoelectric generators T in the one thermoelectric generator unit 100 and a second plurality of openings communicating with the respective flow paths of the multiple tubular thermoelectric generators T in the other thermoelectric generator unit 100. Naturally, two or more of the thermoelectric generator units 100, 100A and 100B may be used in combination. Those thermoelectric generator units may be connected either in series to each other or parallel with each other.

Figure 26A:
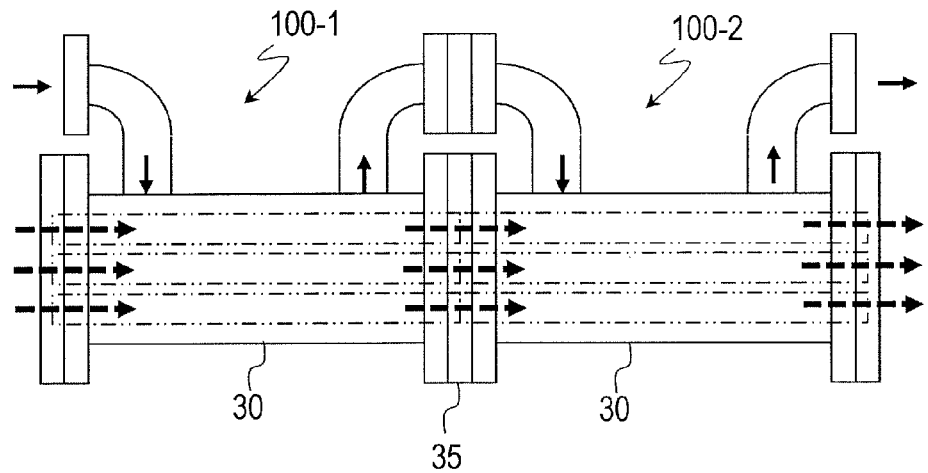
FIG. 26A illustrates an exemplary configuration for a thermoelectric generator system including a plurality of thermoelectric generator units.
Figure 26B:
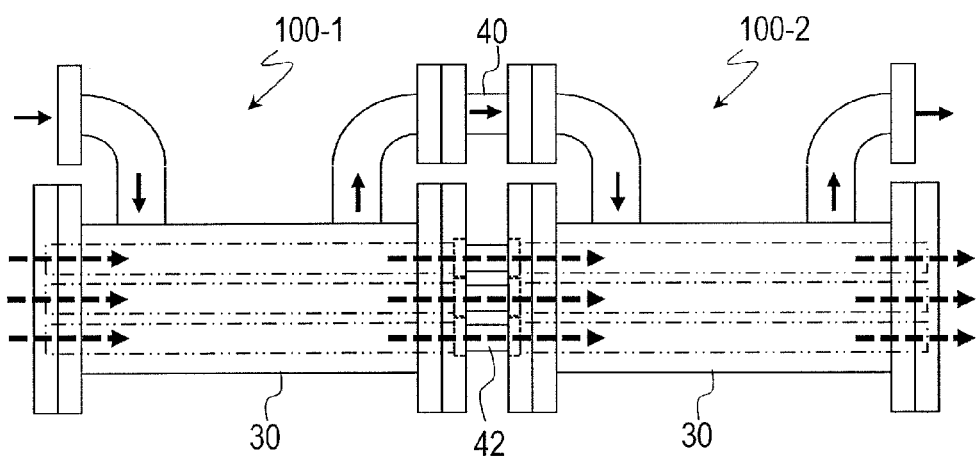
FIG. 26B illustrates another exemplary configuration for a thermoelectric generator system including a plurality of thermoelectric generator units.
Figure 26C:
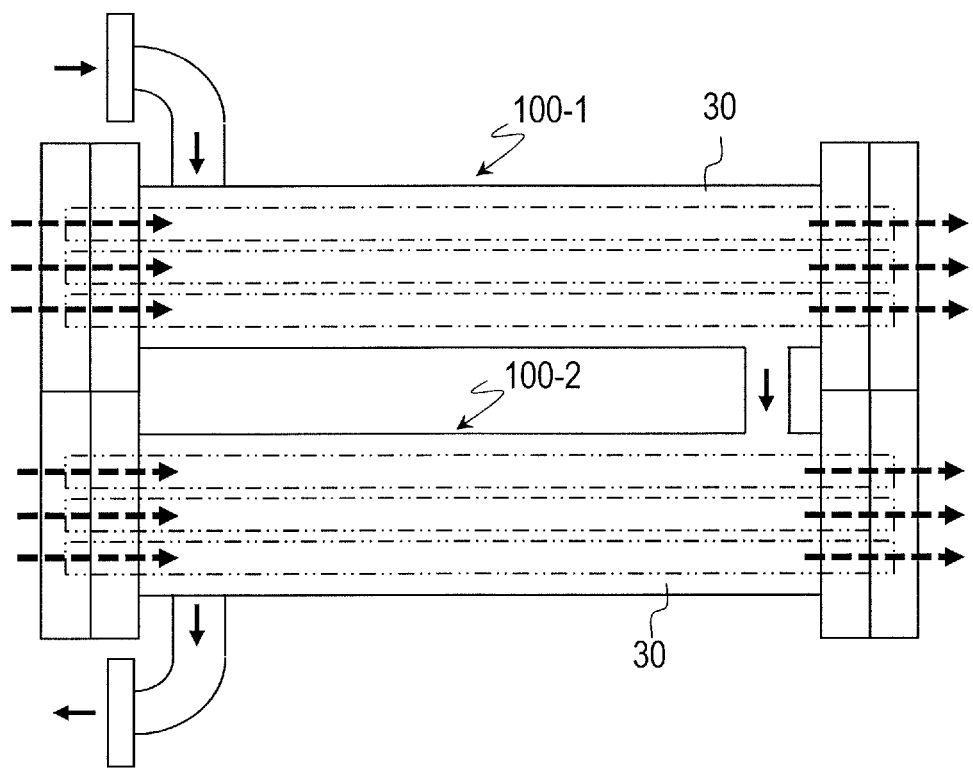
FIG. 26C illustrates still another exemplary configuration for a thermoelectric generator system including a plurality of thermoelectric generator units.

Next, an exemplary configuration for a thermoelectric generator system including a plurality of thermoelectric generator units will be described with reference to FIGS. 26A, 26B and 26C. In FIGS. 26A, 26B and 26C, the bold solid arrows generally indicate the flow direction of the medium in contact with the outer peripheral surface of a tubular thermoelectric generator (i.e., the medium flowing inside of the container 30 (and outside of the tubular thermoelectric generator)). On the other hand, the bold dashed arrows generally indicate the flow direction of the medium in contact with the inner peripheral surface of a tubular thermoelectric generator (i.e., the medium flowing through the through hole (i.e., the inner flow path)). In the present specification, a path communicating with the fluid inlet and outlet ports of each container 30 will sometimes be referred to as a "first medium path" and a path encompassing the respective flow paths of the plurality of tubular thermoelectric generators will sometimes be referred to as a "second medium path" hereinbelow.

First of all, look at FIG. 26A. The thermoelectric generator system shown in FIG. 26A includes first and second thermoelectric generator units 100-1 and 100-2, each of which may have the same configuration as the thermoelectric generator unit 100 described above. In the example illustrated in FIG. 26A, the space communicating with the fluid inlet and outlet ports of the container 30 of the first thermoelectric generator unit 100-1 and with the fluid inlet and outlet ports of the container 30 of the second thermoelectric generator unit 100-2 forms the first medium path. Also, in the example illustrated in FIG. 26A, an intervening plate 35 is provided to make the respective flow paths of the multiple tubular thermoelectric generators that the first thermoelectric generator unit 100-1 has communicate with their associated flow paths of the multiple tubular thermoelectric generators that the second thermoelectric generator unit 100-2 has. As a result, a second medium path, communicating with the respective flow paths of the tubular thermoelectric generators T of the first and second thermoelectric generator units 100-1 and 100-2, is formed.

Next, look at FIG. 26B. As in the example shown in FIG. 26A, the thermoelectric generator system shown in FIG. 26B also includes first and second thermoelectric generator units 100-1 and 100-2. In the example shown in FIG. 26B, however, the respective flow paths of the multiple tubular thermoelectric generators that the first thermoelectric generator unit 100-1 has and their associated flow paths of the multiple tubular thermoelectric generators that the second thermoelectric generator unit 100-2 has communicate with each other via conduits 42. The medium that has been supplied into the container 30 of the first thermoelectric generator unit 100-1 is supplied to the inside of the container 30 of the second thermoelectric generator unit 100-2 through another conduit 40. It should be noted that these conduits 40, 42 do not have to be straight ones but may be bent ones, too.

Next, look at FIG. 26C. The thermoelectric generator system shown in FIG. 26C includes first and second thermoelectric generator units 100-1 and 100-2 which are arranged parallel with each other. In the example illustrated in FIG. 26C, the medium flowing through the tubular thermoelectric generators of the first thermoelectric generator unit 100-1 and the medium flowing through the tubular thermoelectric generators of the second thermoelectric generator unit 100-2 run parallel to each other. However, the medium that has been supplied into the container 30 of the first thermoelectric generator unit 100-1 is also supplied into the container 30 of the second thermoelectric generator unit 100-2.

As can be seen, in a thermoelectric generator system including a plurality of thermoelectric generator units, the flow paths of the hot and cold media may be designed in various manners. FIGS. 26A, 26B and 26C illustrate just some examples of those various designs. And the first medium path communicating with the fluid inlet and outlet ports of respective containers and the second medium path encompassing the respective flow paths of the tubular thermoelectric generators may be designed arbitrarily. In the exemplary embodiments shown in FIGS. 26A, 26B and 26C, the second medium path is configured to make the fluid flow in the same direction through the respective flow paths of the multiple tubular thermoelectric generators T. However, the fluid does not have to flow in the same direction through the respective flow paths of the multiple tubular thermoelectric generators T. Rather the direction in which the fluid flows through the respective flow paths of those tubular thermoelectric generators T may be set in various manners according to the design of the flow paths of the hot and cold media.

In each of the thermoelectric generator units, wires W, each of which has its one end connected to an associated electrically conductive member, may be extended out of the plate through the testing hole portions Ch and aggregated together in a single terminal box. By getting a terminal box Tbx such as the ones shown in FIGS. 12A and 12B shared by multiple thermoelectric generator units, electrical information about the respective electrically conductive members can be gotten more easily.

<Exemplary Configuration for Thermoelectric Generator System's Electric Circuit>

Next, an exemplary configuration for an electric circuit that the thermoelectric generator system may include will be described with reference to FIG. 27.

Figure 27:
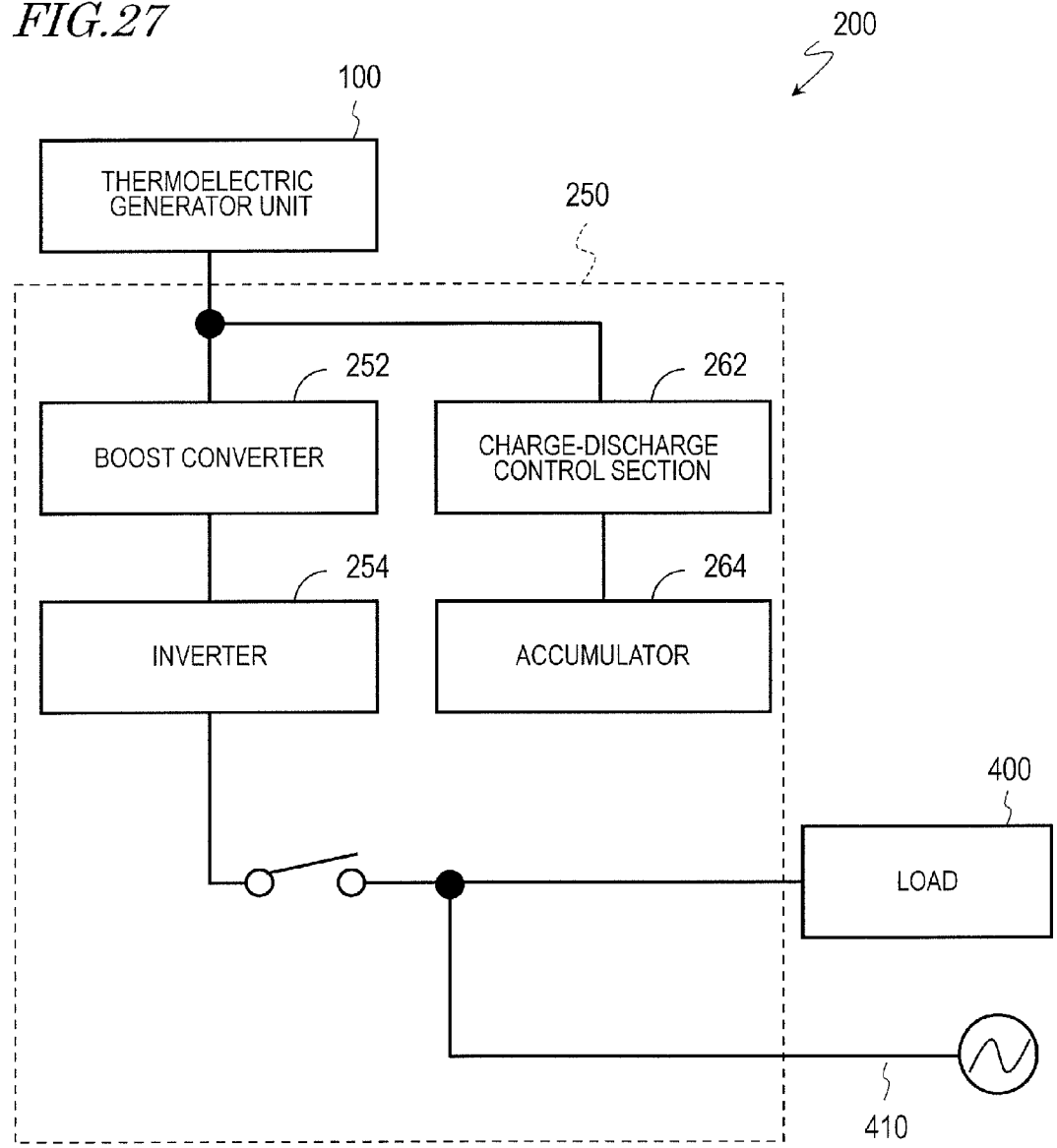
FIG. 27 is a block diagram illustrating an exemplary configuration for an electric circuit that the thermoelectric generator system may include.

In the example shown in FIG. 27, the thermoelectric generator system 200 includes an electric circuit 250 which receives electric power from the thermoelectric generator unit (e.g., the thermoelectric generator unit 100 in this example). The electric circuit 250 includes a boost converter 252 which boosts the voltage of the electric power supplied from the thermoelectric generator unit 100, and an inverter (DC-AC inverter) 254 which converts the DC power supplied from the boost converter 252 into AC power (of which the frequency may be 50/60 Hz, for example, but may also be any other frequency). The AC power may be supplied from the inverter 254 to a load 400. The load 400 may be any of various electrical or electronic devices that operate using AC power. The load 400 may have a charging function in itself, and does not have to be fixed to the electric circuit 250. Any AC power that has not been dissipated by the load 400 may be connected to a commercial grid 410 so that the electricity can be sold.

The electric circuit 250 in the example shown in FIG. 27 includes a charge-discharge control section 262 and an accumulator 264 for storing the DC power obtained from the thermoelectric generator unit 100. The accumulator 264 may be a chemical battery such as a lithium ion secondary battery, or a capacitor such as an electric double-layer capacitor, for example. The electric power stored in the accumulator 264 may be fed as needed to the boost converter 252 by the charge-discharge control section 262, and may be used or sold as AC power via the inverter 254.

The magnitude of the electric power supplied from the thermoelectric generator unit 100 may vary with time either periodically or irregularly. For example, if the heat source of the hot medium is the waste heat discharged from a factory, the temperature of the hot medium may vary according to the operating schedule of that factory. In that case, the power generation state of the thermoelectric generator unit 100 will vary so significantly that the voltage of the electric power supplied from the thermoelectric generator unit 100 and/or the amount of electric current will vary, too. However, even if the power generation state varies in this manner, the thermoelectric generator system 200 shown in FIG. 27 can also minimize the influence caused by such a variation in power output level by making the charge-discharge control section 262 accumulate electric power in the accumulator 264.

If the electric power generated is dissipated in real time, then the voltage step-up ratio of the boost converter 252 may be adjusted according to the variation in power generation state. Alternatively, a control operation may also be carried out so that the power generation state is maintained in steady state by regulating the flow rate, temperature and other parameters of the hot or cold medium to be supplied to the thermoelectric generator unit 100 with such a variation in power generation state sensed or predicted.

Now take a look at FIG. 4 again. In the system illustrated in FIG. 4, the flow rate of the hot medium may be adjusted by the pump P1. In the same way, the flow rate of the cold medium may be adjusted by the pump P2. By adjusting the flow rate(s) of one or both of the hot and cold media, the power output level of the tubular thermoelectric generator can be controlled.

Optionally, the temperature of the hot medium may be controlled by adjusting the quantity of heat supplied from a high-temperature heat source (not shown) to the hot medium. In the same way, the temperature of the cold medium may also be controlled by adjusting the quantity of heat dissipated from the cold medium into a low-temperature heat source (not shown, either).

Although not shown in FIG. 4, the flow rates of the respective media supplied to the thermoelectric generator system may be adjusted by providing a valve and a branch path for at least one of the flow paths of the hot and cold media.

<Another Example of Thermoelectric Generator System>

Another example of a thermoelectric generator system including the thermoelectric generator unit will now be described with reference to FIG. 28.

A thermoelectric generator unit according to the present disclosure is applicable to a general waste disposal facility (that is a so-called "garbage disposal facility" or a "clean center"). In recent years, at a waste disposal facility, high-temperature, high-pressure steam (at a temperature of 400 to 500 degrees Celsius and at a pressure of several MPa) is sometimes generated from the thermal energy produced when garbage (waste) is incinerated. Such steam energy is converted into electricity by turbine generator and the electricity thus generated is used to operate the equipment in the facility.

Figure 28:
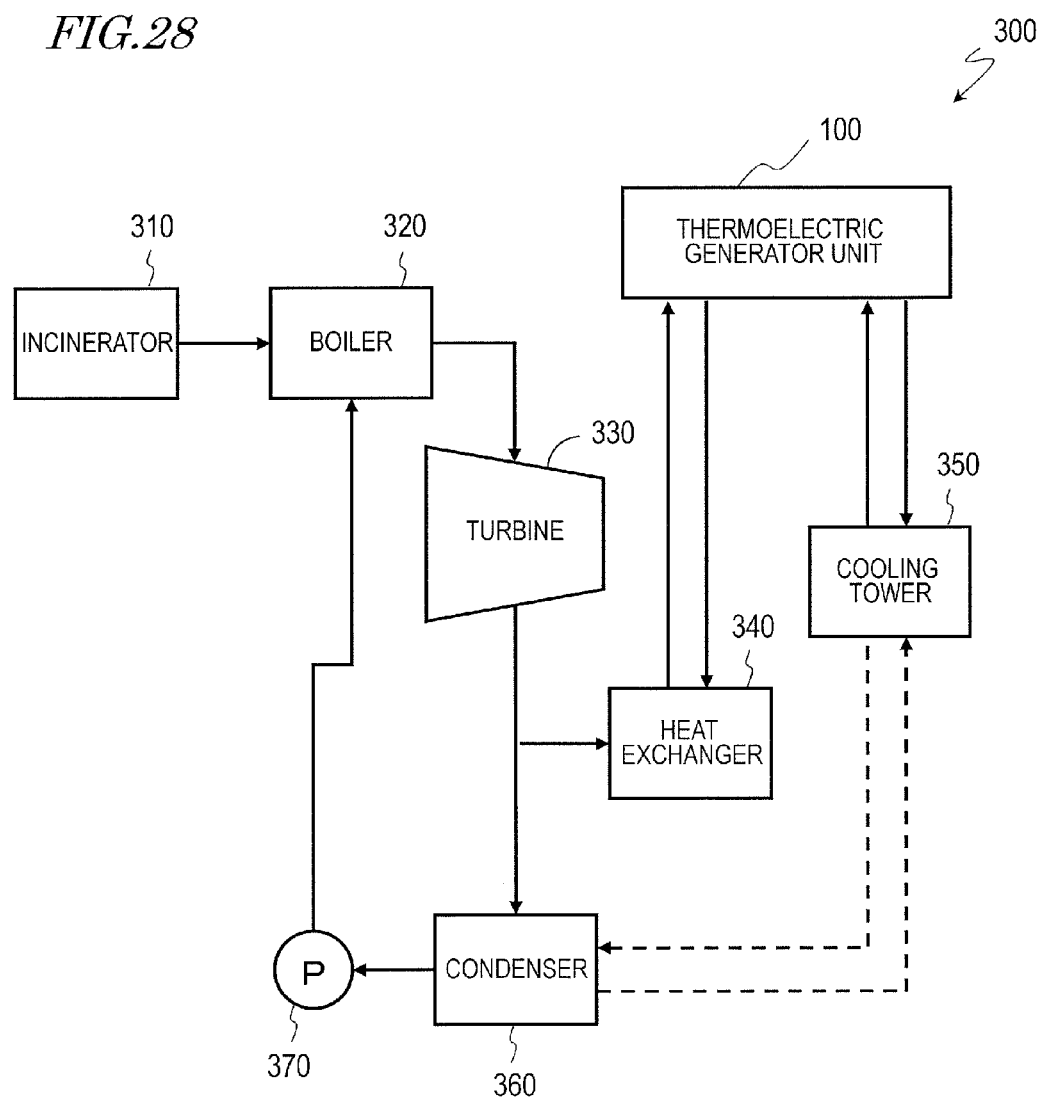
FIG. 28 is a block diagram illustrating an exemplary configuration for another embodiment in which a thermoelectric generator system including the thermoelectric generator units may be used.

The exemplary thermoelectric generator system 300 shown in FIG. 28 includes at least one of the thermoelectric generator units described above. In the example illustrated in FIG. 28, the hot medium supplied to the thermoelectric generator unit (e.g., the thermoelectric generator unit 100 in this example) has been produced based on the heat of combustion generated at the waste disposal facility. More specifically, this system includes an incinerator 310, a boiler 320 to produce high-temperature, high-pressure steam based on the heat of combustion generated by the incinerator 310, and a turbine 330 which is driven by the high-temperature, high-pressure steam produced by the boiler 320. The energy generated by the turbine 330 driven is given to a synchronous generator (not shown), which converts the energy into AC power (such as three-phase AC power).

The steam that has been used to drive the turbine 330 is turned back by a condenser 360 into liquid water, which is then supplied by a pump 370 to the boiler 320. This water is a working medium that circulates through a "heat cycle" formed by the boiler 320, turbine 330 and condenser 360. Part of the heat given by the boiler 320 to the water does work to drive the turbine 330 and then is given by the condenser 360 to cooling water. In general, cooling water circulates between the condenser 360 and a cooling tower 350.

As can be seen, only a part of the heat generated by the incinerator 310 is converted by the turbine 330 into electricity, and the thermal energy that the low-temperature, low-pressure steam has after the turbine 330 has been driven has not been converted into, and used as, electrical energy but often just dumped into the ambient according to conventional technologies. However, this thermoelectric generator unit 100 can use effectively the low-temperature steam or hot water that has done work to drive the turbine 330 as a heat source for the hot medium. In the example shown in FIG. 28, heat is obtained by the heat exchanger 340 from the steam at such a low temperature (of 140 degrees Celsius, for example) and hot water at 99 degrees Celsius is obtained, for example. And this hot water is supplied as hot medium to the thermoelectric generator unit 100.

On the other hand, a part of the cooling water used at a waste disposal facility, for example, may be used as the cold medium. If the waste disposal facility has the cooling tower 350, water at about 10 degrees Celsius can be obtained from the cooling tower 350 and used as the cold medium. Alternatively, the cold medium does not have to be obtained from a special cooling tower but may also be well water or river water inside the facility or in the neighborhood.

The thermoelectric generator unit 100 shown in FIG. 28 may be connected to the electric circuit 250 shown in FIG. 27, for example. The electricity generated by the thermoelectric generator unit 100 may be either used in the facility or accumulated in the accumulator 264. The extra electric power may be converted into AC power and then sold through the commercial grid 410.

The thermoelectric generator system 300 shown in FIG. 28 has a configuration in which thermoelectric generator units according to the present disclosure are incorporated into the waste heat utilization system of a waste disposal facility including the boiler 320 and the turbine 330. However, to operate the thermoelectric generator units of the present disclosure, the boiler 320, turbine 330, condenser 360 and heat exchanger 340 are not indispensable members. If there is any gas or hot water at a relatively low temperature which has been just disposed of according to conventional technologies, that gas or water may be effectively used as hot medium directly. Or another gas or liquid may be heated by a heat exchanger and used as a hot medium. The system shown in FIG. 28 is just one of many practical examples.

As is clear from the foregoing description of embodiments, a thermoelectric generator unit according to an embodiment of the present disclosure can electrically connect a plurality of tubular thermoelectric generators together with good stability using electrically conductive members housed in a channel on a plate. Such tubular thermoelectric generators are used in an environment in which the generators are in contact with a hot medium and a cold medium. That is why the electrical connection portions might cause electrical leakage or corrosion if these portions come into contact with these media. According to an embodiment of the present disclosure, however, the electrically conductive members can be arranged in a space in which sealing from the hot and cold media can be established relatively easily, and therefore, those tubular thermoelectric generators can be not only electrically connected together but also sealed easily.

In addition, according to an embodiment of the present disclosure, electrical or thermal information about the electrically conductive members can be retrieved out of the thermoelectric generator unit through the channel's testing hole portions. In this case, since the electrically conductive members housed in the channel are separated from the hot and cold media, the failures can be located without stopping the operation of the thermoelectric generator unit. As a result, practicality of thermoelectric generation increases.

As is clear from the foregoing description, an exemplary method of testing a thermoelectric generator unit according to the present disclosure includes the steps of: inserting a probe into a testing hole portion in the channel of the plate of the thermoelectric generator unit; bringing a tip end of the probe into contact with the electrically conductive member housed in the interconnection of the channel; and getting electrical or thermal information about the electrically conductive member with which the tip of the probe is in contact.

A thermoelectric generator unit as one implementation of the present disclosure comprises: a plurality of tubular thermoelectric generators, each of which has an outer peripheral surface, an inner peripheral surface and a flow path defined by the inner peripheral surface, and each of which generates electromotive force in an axial direction of each said tubular thermoelectric generator based on a difference in temperature between the inner and outer peripheral surfaces; a plurality of electrically conductive members providing electrical connection for the plurality of tubular thermoelectric generators; and a container housing the plurality of tubular thermoelectric generators inside, the container having fluid inlet and outlet ports through which a fluid flows inside the container, a plurality of openings into which the respective tubular thermoelectric generators are inserted, a shell surrounding the plurality of tubular thermoelectric generators, and a pair of plates, each of which is fixed to the shell and at least one of which has the plurality of openings and channels, each channel housing an electrically conductive member. In one embodiment, the respective ends of the tubular thermoelectric generators are inserted into the plurality of openings of the plates, at least one of the channels has an interconnection which connects at least two of the plurality of openings together and a testing hole portion which runs from the interconnection through an outer edge of the at least one plate, and the plurality of tubular thermoelectric generators are electrically connected together in series via the electrically conductive member that is housed in the interconnection of the at least one channel.

In one embodiment, two of the channels are terminal connections, each of which runs from one of the plurality of openings of the plate through an outer edge thereof.

In one embodiment, the plurality of electrically conductive members include: at least one connection plate with two through holes, into which two of the tubular thermoelectric generators are respectively inserted; and two terminal plates, each having a single through hole into which one of the tubular thermoelectric generators is inserted and having one end that sticks out, the at least one connection plate is housed in the interconnection of the at least one channel, the two terminal plates are respectively housed in the two terminal connections, a portion of each said terminal plate sticking out of the plate, and the at least one connection plate and the two terminal plates are electrically connected to the tubular thermoelectric generators inserted into the through holes.

In one embodiment, the at least one connection plate has a branch portion, and an end of the branch portion sticks out of the plate through the testing hole portion.

The thermoelectric generator unit may further comprises a wire, one end of which is electrically connected to the at least one connection plate and the other end of which is extended out of the plate through the testing hole portion.

The thermoelectric generator unit may further comprises a terminal box including a plurality of terminals. Each of the plurality of terminals may be electrically connected to an associated one of the electrically conductive members through the testing hole portion.

The thermoelectric generator unit may further comprises a terminal box which is arranged at the outer edge of one of the pair of plates and which includes a terminal. A portion of the wire extended out of the plate may be arranged along the outer edge of the plate, and the other end of the wire may be electrically connected to the terminal.

In one embodiment, the at least one connection plate has a threaded hole which has been cut parallel to the direction in which the testing hole portion runs.

In one embodiment, each of the plurality of openings has a first seating surface to receive a first O-ring inserted into the opening from outside of the shell, at least one of the pair of plates include: a first plate portion which is fixed to the shell and in which the first seating surface has been formed; and a second plate portion which is attached removably to the first plate portion, the plurality of openings running through the first and second plate portions, each of the plurality of openings of the second plate portion has a second seating surface to receive a second O-ring inserted into the opening, and in each channel, the electrically conductive member is arranged between the first and second O-rings.

In one embodiment, at least one of respective sealing surfaces of the first and second plate portions has a groove portion, the surface of which forms part of an inner peripheral surface of the testing hole portion.

In one embodiment, the at least one plate has an insulating coating which covers the inner peripheral surface of the testing hole portion of the at least one channel.

In one embodiment, the testing hole portion of the at least one channel runs straight from the interconnection through the outer edge of the plate.

In one embodiment, the testing hole portion of the at least one channel has a ramified portion inside of the plate.

In one embodiment, the at least one plate has a cap capable of closing the testing hole portion of the at least one channel.

Another implementation of the present disclosure is a method of testing the thermoelectric generator unit set forth above. The method comprises: inserting a probe into the testing hole portion of the at least one channel; bringing a tip end of the probe into contact with the electrically conductive member housed in the interconnection; and getting electrical or thermal information about the electrically conductive member with which the tip end is in contact.

A thermoelectric generator unit according to the present disclosure may be used as a power generator which utilizes the heat of an exhaust gas exhausted from a car or a factory, for example, or as a small-sized portable power generator.

While the present invention has been described with respect to exemplary embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A thermoelectric generator unit comprising:
a plurality of tubular thermoelectric generators, each of which has an outer peripheral surface, an inner peripheral surface and a flow path defined by the inner peripheral surface, and each of which generates electromotive force in an axial direction of each said tubular thermoelectric generator based on a difference in temperature between the inner and outer peripheral surfaces;
a plurality of electrically conductive members for electrically connecting the plurality of tubular thermoelectric generators; and
a container housing the plurality of tubular thermoelectric generators inside, the container having fluid inlet and outlet ports through which a fluid flows inside the container, a plurality of openings into which the respective tubular thermoelectric generators are inserted, a shell surrounding the plurality of tubular thermoelectric generators, and a pair of plates, each of which is fixed to the shell and at least one of which has the plurality of openings and a plurality of channels, each channel housing an electrically conductive member,
wherein respective ends of the tubular thermoelectric generators are inserted into the plurality of openings of the plates,
at least one of the channels has an interconnection which connects at least two of the plurality of openings together and a testing hole portion which runs from the interconnection through an outer edge of the at least one plate, and
the plurality of tubular thermoelectric generators are electrically connected together in series via the electrically conductive member that is housed in the interconnection of the at least one channel.

2. The thermoelectric generator unit of claim 1, wherein two of the channels are terminal connections, each of which runs from one of the plurality of openings of the plate through an outer edge thereof.

3. The thermoelectric generator unit of claim 2, wherein the plurality of electrically conductive members include:
at least one connection plate with two through holes, into which two of the tubular thermoelectric generators are respectively inserted; and
two terminal plates, each having a single through hole into which one of the tubular thermoelectric generators is inserted and having one end that sticks out,
the at least one connection plate is housed in the interconnection of the at least one channel,
the two terminal plates are respectively housed in the two terminal connections, a portion of each said terminal plate sticking out of the plate, and
the at least one connection plate and the two terminal plates are electrically connected to the tubular thermoelectric generators inserted into the through holes.

4. The thermoelectric generator unit of claim 3, wherein the at least one connection plate has a branch portion, and
an end of the branch portion sticks out of the plate through the testing hole portion.

5. The thermoelectric generator unit of claim 3, further comprising a wire, one end of which is electrically connected to the at least one connection plate and the other end of which is extended out of the plate through the testing hole portion.

6. The thermoelectric generator unit of claim 1, further comprising a terminal box including a plurality of terminals,
wherein each of the plurality of terminals is electrically connected to an associated one of the electrically conductive members through the testing hole portion.

7. The thermoelectric generator unit of claim 5, further comprising a terminal box which is arranged at the outer edge of one of the pair of plates and which includes a terminal,
a portion of the wire extended out of the plate is arranged along the outer edge of the plate, and
the other end of the wire is electrically connected to the terminal.

8. The thermoelectric generator unit of claim 5, wherein the at least one connection plate has a threaded hole which has been cut parallel to the direction in which the testing hole portion runs.

9. The thermoelectric generator unit of claim 1, wherein each of the plurality of openings has a first seating surface to receive a first O-ring inserted into the opening from outside of the shell,
at least one of the pair of plates include: a first plate portion which is fixed to the shell and in which the first seating surface has been formed; and a second plate portion which is attached removably to the first plate portion, the plurality of openings running through the first and second plate portions,
each of the plurality of openings of the second plate portion has a second seating surface to receive a second O-ring inserted into the opening, and
in each channel, the electrically conductive member is arranged between the first and second O-rings.

10. The thermoelectric generator unit of claim 9, wherein at least one of respective sealing surfaces of the first and second plate portions has a groove portion, the surface of which forms part of an inner peripheral surface of the testing hole portion.

11. The thermoelectric generator unit of claim 1, wherein the at least one plate has an insulating coating which covers an inner peripheral surface of the testing hole portion of the at least one channel.

12. The thermoelectric generator unit of claim 1, wherein the testing hole portion of the at least one channel runs straight from the interconnection through the outer edge of the plate.

13. The thermoelectric generator unit of claim 1, wherein the testing hole portion of the at least one channel has a ramified portion inside of the plate.

14. The thermoelectric generator unit of claim 1, wherein the at least one plate has a cap capable of closing the testing hole portion of the at least one channel.

15. A method of testing the thermoelectric generator unit of claim 1, the method comprising:
inserting a probe into the testing hole portion of the at least one channel;
bringing a tip end of the probe into contact with the electrically conductive member housed in the interconnection; and
getting electrical or thermal information about the electrically conductive member with which the tip end is in contact.

* * * * *